US006337536B1

(12) United States Patent
Matsubara et al.

(10) Patent No.: US 6,337,536 B1
(45) Date of Patent: Jan. 8, 2002

(54) WHITE COLOR LIGHT EMITTING DIODE AND NEUTRAL COLOR LIGHT EMITTING DIODE

(75) Inventors: Hideki Matsubara; Koji Katayama; Toshihiko Takebe, all of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/336,764

(22) Filed: Jun. 21, 1999

(30) Foreign Application Priority Data

| Jul. 9, 1998 | (JP) | 10-194156 |
| Nov. 6, 1998 | (JP) | 10-316169 |
| Nov. 12, 1998 | (JP) | 10-321605 |

(51) Int. Cl.[7] .............................................. H01L 33/00
(52) U.S. Cl. ...................... 313/498; 313/499; 257/461; 257/607
(58) Field of Search ................................ 313/498, 499, 313/500, 501, 502, 503, 504, 512; 428/700, 690, 917; 257/103, 89, 463, 461, 607, 102, 200

(56) References Cited

U.S. PATENT DOCUMENTS

| 4,570,172 A | 2/1986 | Henry et al. |
| 5,198,690 A | * 3/1993 | Kitagawa et al. ........... 257/200 |

FOREIGN PATENT DOCUMENTS

| EP | 0 486 052 | 11/1991 |
| JP | 10-56203 | 2/1998 |
| JP | 2000164931 A | * 6/2000 ........... H01L/33/00 |

OTHER PUBLICATIONS

"The Blue Laser Diode, GaN Based Light Emitters and Lasers", Shuji Nakamura, et al., Springer–Verlag, (Jan. 1997) 216–221.

"Internal photoluminescene and lifetime of light–emitting diodes on conductive ZnSe substrates", H. Wenisch, et al., *J. Appl. Phys.* 82 (9), (Nov. 1, 1997) 4690–4696; and.

"Iodine–Doped Low–Resistivity n–Type ZnSe Films Grown by MOVPE", Noriyoshi Shibata, et al., *Jornal of Crystal Growth* 93 (1988) 703–707.

* cited by examiner

Primary Examiner—Nimeshkumar D. Patel
Assistant Examiner—Karabi Guharay
(74) Attorney, Agent, or Firm—Smith, Gambrell & Russell, LLP

(57) ABSTRACT

A white color or neutral color LED having an n-type ZnSe single crystal substrate doped with I, Cl, Br, Al, Ga or In as SA-emission centers and an epitaxial film structure including a ZnSe, ZnCdSe or ZnSeTe active layer and a pn-junction. The active layer emits blue or bluegreen light. The SA-emission centers in the ZnSe substrate convert blue or bluegreen light to yellow or orange SA-emission. The blue or bluegreen light from the epitaxial film structure and the yellow or orange light from the ZnSe substrate synthesize white color light or neutral color light between red and blue.

19 Claims, 23 Drawing Sheets

EMBODIMENT 1.2

GaInN LED

B··· blue light from the epitaxial emission structure
Y··· SA emission from the ZnSe substrate (yellow)

EMBODIMENT 1.2

EMBODIMENT 3

EMBODIMENT 4

EMBODIMENT 5 chemical vapor transport method $$ZnI_2 + (1/2)Se_2 \rightarrow ZnSe + I_2$$

$$ZnSe + I_2 \rightarrow ZnI_2 + (1/2)Se_2$$

anneal

1000 °C
50 H
cooling −60 °C/min

Molecular Beam Epitaxial Growing Apparatus

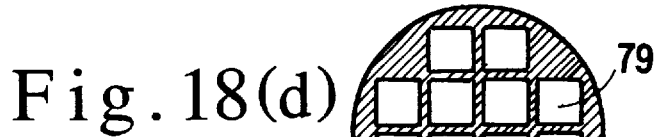
Fig. 18(a)
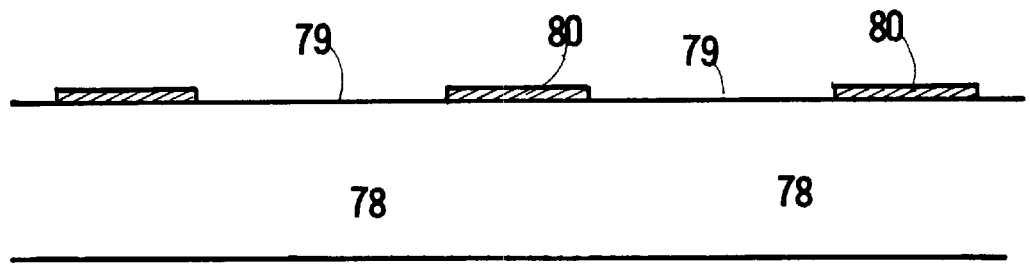
Fig. 18(b)
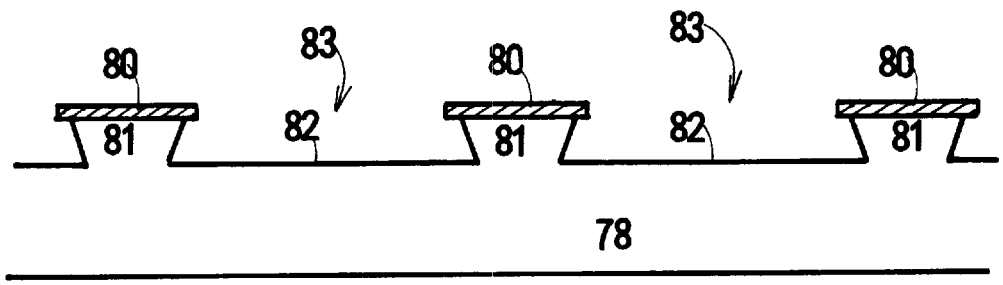
Fig. 18(c)
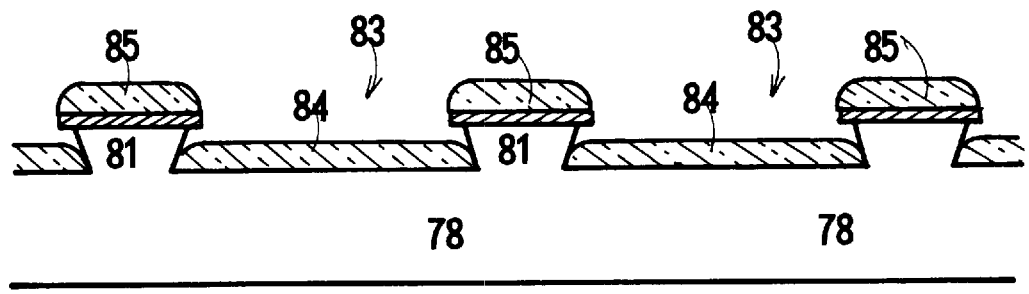

Fig.19 EMBODIMENT 7
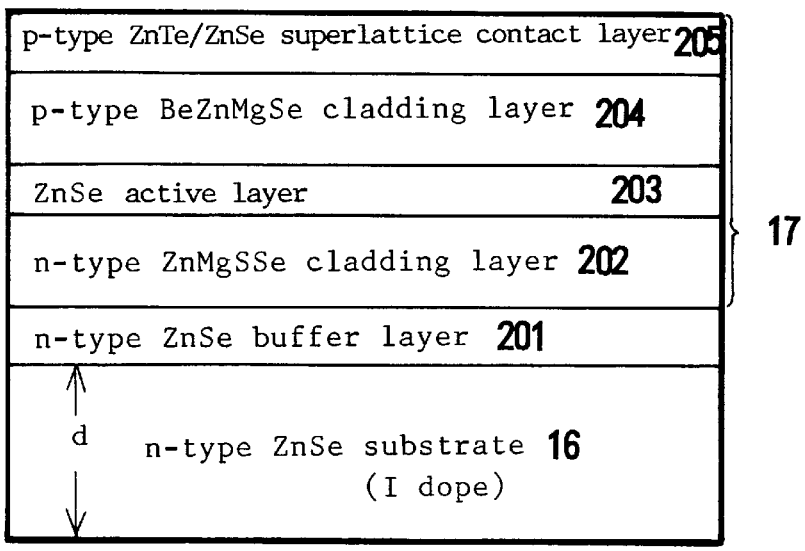
$\alpha : d=50 \mu m \quad \beta : d=250 \mu m \quad \gamma : d=500 \mu m$
Fig.20
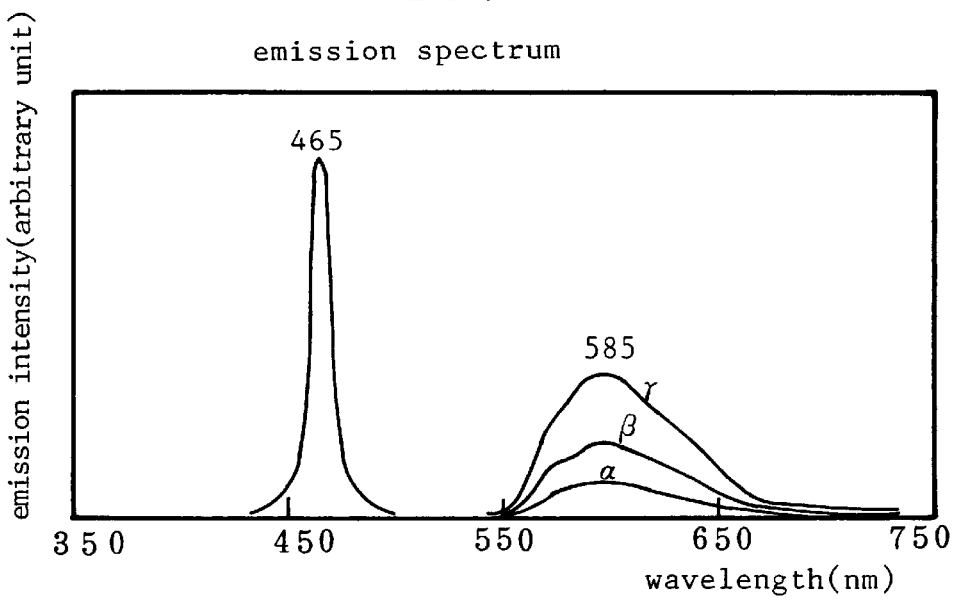

EMBODIMENT 7 chromaticity diagram substrate thickness α··· 50 μm
β···250 μm
γ···500 μm

EMBODIMENT 8
film strata $\delta : d = 250\mu m \quad \varepsilon : d = 1000 \mu m$ EMBODIMENT 8
emission spectrum substrate thickness  $\delta \cdots 250 \mu m$
$\varepsilon \cdots 1000 \mu m$

Fig. 25  EMBODIMENT 9
film strata
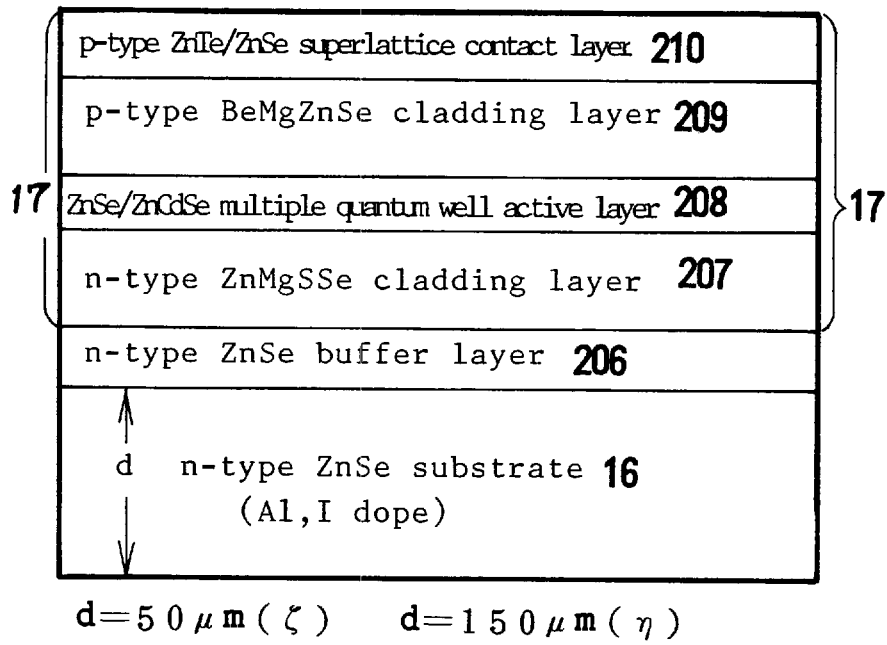
$d = 50 \mu m (\zeta)$    $d = 150 \mu m (\eta)$
Fig. 26
EMBODIMENT 9
emission spectrum
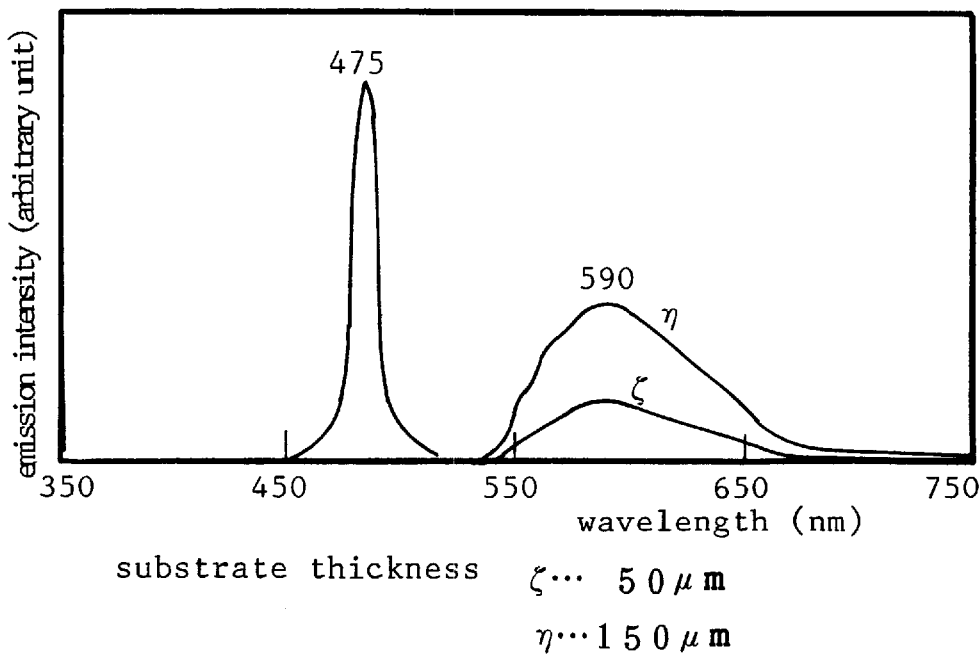
substrate thickness    $\zeta \cdots 50 \mu m$
$\eta \cdots 150 \mu m$

Fig.29

| | | EMBODIMENT 7 | EMBODIMENT 8 | EMBODIMENT 9 | | | |
|---|---|---|---|---|---|---|---|
| Substrate | Material | I−ZnSe | Al−ZnSe | I,Al−ZnSe | | | |
| | Wave-length | 585nm | 610nm | 590nm | | | |
| Epitaxial film emission structure | Material | ZnSe | ZnSe | ZnSe/ZnCdSe | | | |
| | Wave-length | 465nm | 465nm | 475nm | | | |
| Substrate thickness ($\mu$ m) | | 50 | 250 | 500 | 250 | 1000 | 50 | 150 |
| Embodiment symbol | | $\alpha$ | $\beta$ | $\gamma$ | $\delta$ | $\varepsilon$ | $\zeta$ | $\eta$ |
| Chromaticity coordinate | x | 0.24 | 0.36 | 0.40 | 0.36 | 0.50 | 0.42 | 0.50 |
| | y | 0.15 | 0.27 | 0.31 | 0.18 | 0.27 | 0.32 | 0.37 |
| Color | | purple | purple-pink | pink | red-purple | red-purple | pink | yellow-pink | chromaticity diagram

① white
② purple
③ redpurple
④ purplish pink
⑤ pink
⑥ yellowish pink

WHITE COLOR LIGHT EMITTING DIODE AND NEUTRAL COLOR LIGHT EMITTING DIODE

BACKGROUND OF THE INVENTION

1. Field of the Invention

This invention relates to a white color light emitting diode (LED) which can produce white light by a single LED chip and further relates to a neutral color LED which can make redpurple light or pink light which is a neutral color between red and blue by a single LED. In particular, this invention is directed to the structure of the white color LED and the neutral color LED. White light is an assembly of a plurality of wavelengths including blue, red, green or so. There is a strong desire for a new light source of white. White light is most suitable for illuminating light sources, since white light includes all primary colors. White light is appropriate for various displays. White light is also used for the backlight of liquid crystal displays (LCD). Neutral tint LEDs between red and purple are also suitable for displays and illumination. This invention proposes the neutral color LED and the white color LED suitable for illumination, displays, LCD backlight and so forth.

This application claims the priority of Japanese Patent Application No. 10-194156(194156/1998) filed on Jul. 9, 1998, Japanese Patent Application No. 10-316169(316169/1998) filed on Nov. 6, 1998 and Japanese Patent Application No. 10-321605(321605/1998) filed on Nov. 12, 1998 which are incorporated herein by reference.

2. Description of Related Art

An LED produces light by lifting electrons by a current and throwing down the electrons over the band gap (forbidden band) between a valence band and a conduction band. The electron transition energy generates light. The band gap is equal to the energy of a photon which is a quantum of light. The band gap of an active layer gives the wavelength of the emitting light. The wavelength determines the color of the light. The color of the light depends upon the material of the active layer of an LED.

All the conventional LEDs have utilized only the electron band gap transition for making light. All the band gap transition LEDs emit monochromatic light (monochromatic LEDs). Monochromatic LEDs of emitting red, yellow, green or blue color have been produced and sold. For example, red light high luminescent LEDs which produce stronger power than several candelas (Cd) have been put on sale. The red light LEDs are based upon active layers of aluminum gallium arsenide (AlGaAs) or gallium arsenide phosphide (GaAsP). Inexpensive red light LEDs have wide scopes of applications. Green/yellowgreen light LEDs having a gallium phosphide (GaP) light emitting layer (active layer) have been manufactured and sold, too. Blue light LEDs including an SiC layer as an active layer have been proposed. Blue/green light LEDs based on an active layer of gallium indium nitride (GaInN) have been on market. LEDs having an AlGaInP active layer are orange/yellow color LEDs. Monochromatic LEDs having the following combinations of the colors and the active layers have been manufactured.

| Colors | Materials of active layers |
|---|---|
| (1) red LED | AlGaAs, GaAsP |
| (2) green-yellowgreen LED | GaP |
| (3) blue LED | SiC |
| (4) blue-green LED | GaInN |
| (5) orange-yellow LED | AlGaInP |

These are already matured as inexpensive practical LEDs. Among these LEDs, GaP LEDs and SiC LEDs have not attained to higher power emission than one candela, because GaP and SiC are indirect transition type semiconductors. What determines the wavelength is the material of the active layer. Such a crystal, that has a desired band gap and satisfies conditions, for example, the lattice matching condition and so on, is selected as an active layer.

All the conventional LEDs can make a single color, because the LEDs make use of the photon emission induced by the band gap transition of electrons. Thus, the conventional LEDs are all monochromatic light sources. Monochromatic LEDs have wide scope of utility for displaying light sources. However, monochromatic LEDs cannot replace all the current light sources. Monochromatic light is impotent to use lighting (illumination), special displays or LCD backlight, since the monochromatic light includes only the light having a single wavelength. If a monochromatic LED were used for a lighting source, illuminated objects would all wear the color emitted from the monochromatic LED instead of the inherent color of the objects. If a monochromatic LED were employed for LCD backlight, the LCD would show monochromatic images of the color.

Lighting or illuminating requires white color light sources which inherently include all primary colors and neutral color light sources which include neutral colors between purple and red. However, there have been no semiconductor LEDs capable of emitting white light yet. Illuminating light is still supplied by incandescent light bulbs or fluorescent lamps in general. Although being cheap, incandescent light bulbs are suffering from a short lifetime and a low luminous efficiency. Fluorescent lamps also suffer from a short lifetime, though they enjoy a higher luminous efficiency than the incandescent light bulbs. Further, the fluorescent lamp requires heavy accessories, e.g. voltage stabilizers. The fluorescent lamps have further the drawbacks of a big size and a heavy weight.

It is hoped that future white and red-purple neutral color light sources satisfy the attributions, that is, small size, simple accessories, long lifetime, high luminous efficiency and low price. One candidate capable of sufficing these difficult requirements would be a semiconductor light emitting device (LED or LD). LEDs are small, light and inexpensive light sources having a long lifetime and high efficiency. However, since LEDs utilize electron transitions across the forbidden gap between the valence band and the conduction band, the LEDs inherently emit monochromatic light. Neither single LEDs nor single LDs can generate white color light due to the electron band gap transition emission. Monochromaticity is the inherent property of LEDs.

With regard to neutral colors, the conventional LEDs can make primary colors (RGB) and restricted neutral colors. The colors the current LEDs can produce are red, orange, yellow, yellowgreen, green, bluegreen, blue, bluepurple and purple. Among them, red, green and blue are primary colors. Orange, yellow and yellowgreen are neural colors between red and green. Bluegreen, bluepurple and purple are neutral colors between blue and green. Among three primary colors, red has the longest wavelength, green has a middle wavelength and blue has the shortest wavelength. Blue and green are a nearer pair. Green and red are another nearer pair. LEDs can make neutral colors between two neighboring primary colors (R-G and G-B). Any neutral colors of the conventional LEDs are still monochromatic colors which possess only one wavelength. Conventional LEDs basing on the band gap transition can produce monochromatic R-G or G-B neutral colors.

Any conventional LED can make neither neutral color between red and blue (R-B) nor neutral color among red, green and blue (R-G-B). Red and blue have very different wavelengths. Neutral colors between blue and red (B-R) and among blue, red and green (P-G-B) are no more monochromatic colors having a single wavelength but complex colors including a plurality of wavelengths. Thus, the white (R-G-B) color and the R-B neutral colors cannot be produced by the electron band gap transition in principle.

Instead of monochromatic light sources, lighting, ornament or display requires neutral colors being a mixture of red and blue and white color being a mixture of blue, green and red. Conventional LEDs utilizing the electron band gap transition are all monochromatic light sources. Although the conventional bluegreen LEDs, bluepurple LEDs and orange LEDs are essentially monochromatic LEDs, each LED has only one peak of wavelength somewhere in the emission spectrum.

The neutral color in the present invention does not mean a monochromatic color intervening between two primary colors but a mixture of primary colors. Monochromatic light source has a single peak in the spectrum. But, the neutral color of the present invention has at least two peaks in the spectrum.

A white color LED would probably be produced by assembling a red color LED, a green color LED and a blue color LED. Red color LEDs and green color LEDs have been widely produced and sold on the market. It had been harder to make blue color LEDs than red or green color LEDs due to the difficulty of making good crystals having a wide band gap. Recently, the blue color LEDs based upon a GaInN active layer and a sapphire substrate have been invented. The blue color LEDs are fabricated and placed on the market at the present time. Three primary color (green, red and blue) LEDs are already on sale. A white color LED could be made by assembling a red color LED, a green color LED and a blue color LED. However, three-component LEDs would enhance the cost of the hybrid LED. The three LEDs would consume electric power three times as large as a single LED. The three-component LED would require a sophisticated power balance for making the white color suitable for illuminating or lighting. The necessity of regulating the power balance would complicate a driving electric circuit. The assembly of the component LEDs would enlarge the device size. Three-component white color LED would bring about no advantages over prevalent incandescent bulbs or fluorescent lamps. It is preferable to make white light by a single LED instead of a set of three LEDs.

A trial has been proposed for fabricating a white color LED consisting of a GaN-type blue LED and a YAG phosphor layer. The YAG-GaN LED is a first-proposed white color LED, which is described in the following textbook. ②Shuji Nakamura & Gerhard Fasol, "The Blue Laser Diode (GaN Based Light Emitters and Lasers), January 1997, Springer, p216–221(1997)".

The YAG-GaN LED is made by burying a GaN-type blue light LED having a GaInN active layer into a YAG pond emitting yellow fluorescence. YAG is an abbreviation of yttrium aluminum garnet. FIG. 1(a) shows a section (a) of the proposed GaN-YAG LED, and FIG. 1(b) shows an enlarged section of the proposed GaN-YAG LED. A dome-shaped transparent plastic mold 1 holds a first stem 2 and a second stem 3. The Γ-formed first stem 2 has a top side arm with a small cavity 4. A GaN-type blue light LED chip 5 having a GaInN active layer is set on the bottom of the cavity 4. The LED 5 has cathode and anode electrodes on the top. The electrodes are connected to the stems 2 and 3 by wires 7 and 8. The cavity 4 is filled with a yellow YAG phosphor 6 for fully covering the GaN-type LED 5. After hardening of the YAG resin, the stems 2 and 3 are molded by the transparent plastic 1.

Conventional photodiodes (PDs) and light emitting diodes (LEDs) are used to employ conductive substrates. Such a conductive substrate can be one of electrodes, mainly a cathode. The conventional PD or LED has only a single electrode (mainly anode) on its top which is connected to a stem by a single wire. However, the current GaN blue light LED employs an insulating sapphire ($Al_2O_3$) crystal as a substrate due to the difficulty of growing good GaN single crystals. A GaN layer is grown on the sapphire substrate and a GaInN active layer is piled on the GaN layer in the GaN-type LED 5. The insulating sapphire substrate cannot be a cathode. The cathode is formed side by side with the anode on the top of the chip. The two top electrodes require two wires for connecting with the stems. The GaN-type blue LED 5 emits blue light when a current flows from the anode to the cathode. A part of the blue light passes through the YAG phosphor pond 6 to an external space. The rest of the blue light is absorbed by the YAG phosphor pond 6 and is converted to yellow light having a longer wavelength than the parent blue light. The YAG pond 6 emits yellow converted light (F). The LED 5 emits blue light (E). The yellow light (F) and the blue light (E) together go out of the plastic mold 1. The yellow and the blue are naturally synthesized. The synthesized color is white, when the ratio of the blue light power and the yellow light power lies within a suitable scope. The GaN-YAG aims at making white color light by superposing the blue light of the GaN-LED on the yellow fluorescence from the YAG pond excited by the blue light.

The LED positively produces light by lifting up and down electrons across the band gap (forbidden band) between the conduction band and the valence band. The fluorescent material passively makes light. When the fluorescent material absorbs the LED light, some electrons jump from the ground band to an excited band. The electrons stay at the excited band for a short time and fall back to the ground band via extra levels called "fluorescence centers". The fluorescence produces the light of lower energy than the original LED light. When the LED is enclosed by the fluorescent material, the LED emits the inherent blue light, and the fluorescent material emits fluorescent light having a longer wavelength than the inherent blue light. The YAG generates yellow fluorescence excited by blue light. When the blue light and the yellow fluorescence mix together in a proper ratio, white color light is synthesized. Blue has the shortest wavelength and the highest energy among three primary colors. The appearance of a blue light LED enables to produce white light.

FIG. 2 shows the emission spectrum of the YAG-GaN LED. The abscissa is the wavelength(nm). The ordinate is the emission intensity (arbitrary unit). The sharp peak of 460 nm originates from the GaN-type LED. 460 nm is equal to the band gap of GaInN. The broad peak of 550 nm arises from the fluorescent YAG pond. Human eyesight cannot discriminate the components (460 nm and 550 nm) of light. The synthesized light seems white color.

The proposed YAG-GaN LED, however, has some drawbacks, which will be pointed out as follows.

(1) Translucent YAG phosphor is filled in the cavity covering the LED. The YAG absorbs the LED light, which brings about a low external quantum efficiency. Although a strong GaInN LED having inherently more than 1 candela of luminosity and more than 5% of external quantum efficiency is employed, the white YAG-GaInN LED has only 0.5 candela and 3.5% of external quantum efficiency due to the absorption by the YAG. The poor transparency of YAG decreases both the luminosity and the quantum efficiency.

(2) The conversion efficiency of the YAG phosphor is only 10%. Such a low conversion efficiency decreases the yellow component. If the thickness of the YAG were increased for reinforcing yellow, the luminosity would be further decreased by the thick YAG. The external quantum efficiency would further be reduced.

(3) The YAG-GaInN hybrid LED requires the YAG phosphor which is an entirely different material from GaN. The existence of a foreign material increases the steps of production. The process cost would be pushed up.

(4) Since the YAG phosphor is filled in the cavity and covers the GaInN-LED. The YAG raises the material cost. The complex shape of the stem for the YAG pond enhances the cost of the stem.

LEDs generally enjoy advantages of small-size, inexpensiveness, low-current and long lifetime. One purpose of the present invention is to provide a white color LED for emitting white color which is an assembly of red, green and blue. Another purpose of the present invention is to provide a neutral color LED emitting red-blue neutral colors e.g., redpurple, pink or so.

As shown in FIG. 30, this invention tries to propose a white color LED which synthesizes white color ① and neutral color LEDs which produce purple②, redpurple③ purplish pink ④, pink ⑤ and yellowish pink ⑥.

FIG. 31 is a general chromaticity diagram. The chromaticity diagram is a graph showing the two-dimensional coordinates of a visible light source color or a visible object color by dividing and numerizing the color stimulus into the stimuli of primary colors red(R), green(G) and blue(B) which correspond to three kinds RGB of color-sensing organs in a human eye. $Q(\lambda)$ denotes the spectrum of a light source. The RGB stimuli on the color-sensing organ are obtained by multiplying the object spectrum $Q(\lambda)$ by the color matching functions for the primary colors RGB. Here, $r(\lambda)$ is the red color matching function, $g(\lambda)$ is the green color matching function and $b(\lambda)$ is the blue color matching function. The red stimulus X to the color-sensing organ is given by $X=\int Q(\lambda)r(\lambda)d\lambda$. The green stimulus Y to the human sensing organ is $Y=\int Q(\lambda)g(\lambda)d\lambda$. The blue stimulus Z is $Z=\int Q(\lambda)b(\lambda)d\lambda$. The chromaticity diagram is a set (x,y) of a normalized red stimulus x and a normalized green stimulus y. The normalized red stimulus x and green stimulus y are given by summing the three integrated stimuli X, Y and Z to (X+Y+Z), dividing the red stimulus X and the green stimulus Y by the sum (X+Y+Z) and obtaining x=X/(X+Y+Z) and y=Y/(X+Y+Z). The normalized z=Z/(X+Y+Z) will be omitted from now for reducing the number of the chromatic parameters. The normalized blue stimulus z can be easily obtained from x and y, since x+y+z=1. The coordinate (x,y) is the set of normalized red stimulus and the normalized green stimulus in the chromaticity diagram. The coordinate system can denote any color by a single point lying within the rectangle isosceles triangle with three corners (0,0),(1,0) and (0,1).

The boundary solid line of a horseshoe shape denotes monochromatic colors in FIG. 31. The horseshoe-shaped boundary curve is determined by the three color matching functions $r(\lambda)$, $g(\lambda)$ and $b(\lambda)$. For example, in the range of the wavelengths of longer than 550 nm, the sensitivity for blue is zero (z=0), the chromaticity coordinates (x,y) of monochromatic colors lie on the line x+y=1. In the ranges of wavelengths shorter than 505 nm, a decrease of the wavelength increases the blue component accompanied by a slow rise of the red component, which separates the monochromatic curve from the y-axis (x=0). Red end of the horseshoe-shaped monochromatic curve is the longest wavelength limit of 680 nm to 980 nm of the visible light. Blue end of the horseshoe curve is the shortest wavelength limit of 380 nm to 410 nm of the visible light. The shortest wavelength end and the longest wavelength end are connected by a straight line which does not correspond to monochromatic colors at all. The straight line is called a purple boundary. The inner region enclosed by the horseshoe curve and the purple boundary denotes neutral colors. The innermost region is the white color region. As shown in FIG. 31, the white region ranges from x=0.22 to x=0.43 and from y=0.21 to y=0.43. Conventional LEDs could not produce the white light within a single device. The lower regions of the neutral colors of pink, purple, redpurple can not be made by the conventional LEDs. One purpose of the present invention is to provide a white color LED which emits white light ① in FIG. 30. Another purpose of the present invention is to provide neutral color LEDs which can produce neutral colors ②, ③, ④, ⑤ and ⑥ below white color in FIG. 30.

OBJECTS AND SUMMARY OF THE INVENTION

Instead of adding a phosphor to an LED, this invention makes the best use of the substrate itself as a fluorescent source. This invention gives the substrate the new role of the fluorescence source which absorbs the LED light from the active layer and produces the light of a longer wavelength than the LED light. An LED has a substrate on which an active layer or other layers are deposited. The active layer positively produces the light of a wavelength determined by the band gap. In the conventional LEDs, the substrate has no contribution to making light. What was the role of the substrates in prior LEDs? The substrates have had only two passive roles of supporting the epitaxial light emission structure and of leading driving current so far.

This invention makes the best use of the ZnSe substrate as a fluorescent material by doping some impurity into the ZnSe substrate. The ZnSe-type active layer emits blue light of a shorter wavelength. The fluorescent substrate produces yellow or orange light of a longer wavelength. White color or neutral colors are made by synthesizing the blue light from the ZnSe-type active layer and the yellow or orange fluorescence from the ZnSe substrate. The advantage of the present invention is to convert a blue light LED to a white or neutral color LED without adding any new parts.

The LED of the invention makes white and neutral color light by combining the active layer emission and the substrate fluorescence. In the case of a single photon absorption process, the fluorescence has a longer wavelength than the original exciting light. Thus, blue light with a short wavelength is pertinent to the excitation light. If the excitation light were longer wavelength light, the synthesized light would be neither white light nor RB neutral light. The excitation light should be blue or bluegreen. Blue excitation light restricts the kinds of the active layers which produce the excitation light by the electron band gap transition. The active layer must have a band gap energy corresponding to the blue. GaInN-type activation layers and ZnSe-type activation layers are known as blue light sources. This invention prefers ZnSe-type active layers for the excitation light sources. The substrate should be fitted to the active layer. The restriction of the lattice matching determines the material of the substrate. Since the active layer has been determined to be ZnSe, the preferable substrate should be ZnSe from the lattice matching condition. Of course, ZnSe-type LEDs have been already produced as blue light LEDs till now. But most of the ZnSe-LEDs have been made upon GaAs substrates (ZnSe/GaAs), since GaAs wafers with low defect density can be easily fabricated and GaAs satisfies the lattice-matching condition to ZnSe. A few of the ZnSe-LEDs have semi-insulating ZnSe substrates. The insulating ZnSe substrate requires two wires for coupling the n-electrode and p-electrode to two leads. None of the blue ZnSe-LEDs have conductive ZnSe substrates.

This invention adopts conductive ZnSe as a substrate for the ZnSe active layer for satisfying the lattice-matching condition. The ZnSe substrates are suitable for other reasons in this invention. We found that some ZnSe substrates have a character of fluorescence.

When ZnSe is doped with iodine (I), aluminum (Al), chlorine (Cl), bromine (Br), gallium (Ga) or indium (In), the ZnSe is converted into an n-type semiconductor. The n-type conduction reduces the resistivity of the ZnSe substrate. At the same time, the impurity atoms form emission centers in the ZnSe substrate. The emission centers absorb short wavelength light, and convert the light to longer wavelength light and emit the longer wavelength light. Absorbing the light of a wavelength shorter than 510 nm, the impurity centers emit self-activated luminescence (SA emission) having a broad spectrum of wavelength ranging from 550 nm to 650 nm. The emission is called self-activated emission. The emission center is called an SA center. The middle wavelength and the full width at half maximum (FWHM) of the SA emission spectrum can be controlled by the selection of impurities (I, Al, Cl, Br, Ga and In) and the concentration of the impurity. The SA emission spectrum is widely dispersed between red and yellow.

In general, ZnSe-type active layers can produce blue light of a wavelength shorter than 510 nm. ZnSe substrates can absorb the light of a wavelength shorter than 510 nm which is longer than the band gap wavelength (460 nm) due to the band tailing phenomenon and can produce SA-emission. The band tailing phenomenon which is important for this invention is inherent and peculiar to impurity-doped ZnSe. Thus, the band tailing phenomenon is clarified. An ordinary semiconductor without defects cannot absorb the light of a wavelength longer than the band gap wavelength. Namely, the ordinary semiconductor does not absorb the light of a wavelength $\lambda > \lambda g$ ($=hc/Eg$). When the semiconductor includes impurities which form impurity levels in the forbidden band, the impurity levels induce extra transition between the impurity levels and the conduction band or between the valence band and the impurity levels. The substrate can absorb the light of a wavelength $\lambda > \lambda g$ due to the impurity levels. The substrate can also the band gap transition emission $\lambda g$ of course. Then, the substrate becomes opaque to the light emitted from an active layer having the same component as the substrate. This is the band tailing phenomenon. What produces the impurity levels is aluminum, iodine, bromine or chlorine, which is called now SA-centers.

The device of the present invention includes two components of;

(1) ZnSe-type LED which emits blue light (460 nm to 510 nm) by the band gap transition of electrons, and (2) ZnSe substrate which emits self-activated light between yellow and red (550 nm to 650 nm).

The excellence of the present invention is a simple structure. In general, an LED is produced by growing various epitaxial layers including an active layer on a substrate. The substrate is indispensable to the LED. The substrate of a prior LED plays only the roles of supporting epitaxial layers and leading an electric current to the active layer. The substrate is a passive component in the prior LED. This invention, however, makes the best use of the substrate as a light emission component. The white light LED is produced by doping an impurity into the ZnSe substrate of a ZnSe blue light LED. This invention increases one step of fabrication but adds no component to the ZnSe LED.

An assembly of the ZnSe active layer and the ZnSe substrate brings about an LED which produces both the blue light and the yellow light. The present invention takes advantage of the properties of the impurity-doped ZnSe substrate causing the SA-emission and the active layer yielding blue light.

The dopants (I, Al, Cl, Br, Ga, In) gives the n-type conduction to the ZnSe substrate in addition to the SA-centers. An LED can be produced by epitaxially growing an n-buffer layer, an n-cladding layer, an active layer and p-contact layer on the n-ZnSe substrate. Both the n-cladding layer and the p-cladding layer have refractive indexes lower than the active layer and band gaps larger than the active layer. The lower refractive indexes and the larger band gaps of the cladding layers have an action of enclosing the carriers and photons within the active layer. The set of the active layer, the contact layer and the cladding layers is called an "epitaxial emission structure" in the present invention.

The epitaxial emission structure includes one of the following active layers;

(1) ZnSe (2) ZnCdSe (3) ZnSeTe.

The epitaxial emission structure can produce blue (LED) light ranging from 460 nm to 510 nm according to the band gap energy. Since all the blue (LED) light has a wavelength less than 510 nm, the active layer light can induce SA-emission at the SA-centers in the ZnSe substrate through the band tailing phenomenon. Consisting of ZnSe, active layer (1) emits the light of a wavelength of 460 nm to 465 nm. Being a mixture of ZnSe and CdSe, active layer (2) makes the light of a wavelength longer than (1). The mixture ratio x ($Zn_{1-x}Cd_xSe$) is omitted here. Active layer (3), a mixture of ZnSe and ZnTe, also makes the light of a longer wavelength than (1). Different mixture ratios x give the active layers (2) and (3) various light of wavelengths between 460 nm and 510 nm.

The LED has an n-ZnSe substrate and a set of epitaxial films of an n-cladding layer, an active layer, p-cladding layer and a p-contact layer grown on the n-ZnSe substrate. A p-electrode is formed upon the p-contact layer. An n-electrode can be formed on the bottom surface of the ZnSe substrate, since the substrate is endowed with the n-type conductivity. Both the p-side and the n-side can be assigned to an outlet of the light. In the case of the p-side outlet, the p-electrode should be a small dotted electrode, an annular electrode having a central opening or a transparent electrode.

In the case of the n-side outlet, the n-electrode should be a small dot electrode, an annular electrode or a transparent electrode. In any cases, the counter electrode can be a wide electrode covering the overall surface for die-bonding directly on the stem.

When an electric current is supplied to the LED for flowing the current across the pn-junction, the active layer makes blue light according to the band gap energy. The dopants of the substrate absorb a part of the blue light and induce the SA-emission of yellow or orange. White color light or neutral color light is produced by the mixing of the active layer blue light and the substrate yellow and orange light.

"White color" includes a wide range of various tones because white is a collective concept. If blue color prevails, the white tends to "cold white". On the contrary, if yellow is prevailing, the white trends to "warm white". The thicker the ZnSe substrate is, the more the blue light emitted from the LED part is absorbed. When the yellow SA-emission is prevailing, the white trends toward "warm white". On the contrary, a thinner ZnSe substrate makes colder white by decreasing both the absorption of blue light and the SA-emission of yellow light. The intensity of the SA-emission can be controlled by varying the thickness of the ZnSe substrate. Namely, the thickness of the ZnSe substrate is an important parameter for determining the ratio of the SA-emission to the LED band gap emission. However, the scope of the substrate thickness is restricted by other conditions. Less than 10 $\mu$m of substrate thicknesses would increase the probability of breaking the substrate at the following steps and would decrease the yield which results in the enhancement of production cost. More than 2 mm of substrate thicknesses would cause too bulky LEDs and would enhance the ratio of the yellow SA-emission beyond white color. The preferable range of the ZnSe substrate thickness is 10 $\mu$m to 2 mm.

The middle wavelength of the SA-emission spectrum can be varied by the choice of dopant and the concentration of the dopant (impurity), as mentioned before. The ratio of the SA-emission can be adjusted by the thickness of the substrate. Various tones ranging from warm white to cold white can be obtained by regulating the three important parameters, the dopant selection, the dopant concentration and the substrate thickness.

A concept of the present invention is shown in FIG. 3(a) and FIG. 3(b). FIG. 3(a) is a section of the whole LED of the invention. FIG. 3(b) is a section of a part of the LED. A Γ-shaped stem 12 has a ZnSe-type LED 15 on the top in a plastic package 11. Another stem 13 dangles from the package 11 in parallel with the stem 12. As shown in FIG. 3(b), the LED 15 has a ZnSe substrate 16 and an epitaxial emission structure 17 grown on the substrate 16. The ZnSe substrate is doped with iodine (I), chlorine (Cl), bromine (Br), aluminum (Al), indium (In) or gallium (Ga) as SA-centers. The bottom surface of the ZnSe substrate 16 is an n-electrode directly bonded on the stem 12 as a cathode. The epitaxial film emission structure 17 includes an n-cladding layer, active layer, p-cladding layer and p-contacting layer. An annular or dot n-electrode is formed on the p-contact layer. The p-electrode is connected by an wire 18 to the stem 13 as an anode.

A driving current induces active blue light (B) in the epitaxial film structure 17. A part of the blue light goes upward out of the LED as blue light. The rest goes downward into the substrate 16 and induces yellow-orange luminescence (Y) at the SA-centers of I, Cl, Br, Al, In or Ga atoms. The SA emission goes upward. The light going upward out of the LED is a sum of the blue light (B) and the SA emission (Y). The synthesized light is white color or neutral colors. The neutral colors are, for example, pink, purple or redpurple lying between red and blue in the chromaticity diagram.

There are some alternatives for the geometric arrangements of the white color LED. One choice is the ordinary arrangement setting the substrate down and the epitaxial film part up like common LEDs. Another choice is the up-side down arrangement positioning the substrate up and the epitaxial film part down. A further contrivance is directed to the structures of the package and the stems for preventing only blue light from going out in a certain direction.

[TYPES OF WHITE OR NEUTRAL COLOR LEDS]

(1) Normal posture type ZnSe white color LED and ZnSe neutral color LED

FIG. 4(a) and FIG. 4(b) show an example of a white color LED or a neutral color LED of the present invention. FIG. 4(a) is a vertical section of the LED device. FIG. 4(b) is a vertical section of only the LED chip. A transparent plastic mold 11 encloses a stem 12, a stem 13 and an LED chip 15. The structure is similar to the conventional LED. The transparent mold package is the cheapest and the common package for LEDs. Of course, a metal can-type package is also available for the LED of the present invention. The kinds of stems and packages can be freely chosen in accordance with purposes. The Γ-shaped stem 12 has no cavity on the top branch 14. The top branch 14 has an even plane. The ZnSe LED 15 of the present invention is fixed on the even plane 14 in the normal posture having a bottom ZnSe substrate 16 and a top epitaxial film 17. The ZnSe substrate 16 is doped with a dopant as SA-center, and the film emission structure, that is, the epitaxial film 17, is epitaxially grown on the ZnSe substrate 16.

The epitaxial emission structure 17 contains films of ZnSe or ZnCdSe and a pn-junction. In general, the epitaxial emission structure 17 is a set of strata of films containing ZnSe as a main component. A ring-shaped or dot-shaped p-electrode is formed on the top region above the pn-junction. The p-electrode is connected to the stem 13 by a wire 18. An n-electrode on the bottom of the substrate is directly connected to the stem 12. One wire is sufficient to connect the LED to the stems, unlike the GaN-YAG LED of FIG. 1(a). The stem 12 is a cathode, and the stem 13 is an anode. A current flowing the pn-junction induces the electron transition over the band gap and produces the light (E) of a wavelength between 460 nm and 510 nm. A part of the intrinsic emission goes down into the ZnSe substrate 16 and invites the SA-emission (F) by the dopant in the substrate. A part of the SA emission (F) directly goes up. The rest of the SA emission (F) is reflected from the bottom of the substrate, turns upward, and goes out passing through the epitaxial film 17. Mixture of the intrinsic LED light (E) and the SA emission (F) goes out of the LED. The mixture light seems white or neutral colors for eyesight, when the ratio of the LED light and the SA emission is in a pertinent scope. This type takes the normal posture bonding the substrate directly on the top 14 of the stem with the top epitaxial layers like ordinary LEDs. However, weak SA emission is a drawback in this type, because the ratio of the inherent band gap transition emission (E) is more than 50% but the ratio of the SA-emission is less than 50%.

(2) Reverse posture (upside-down) type ZnSe white color LED and neutral color LED FIG. 5(a) and FIG. 5(b) show an example of a reverse posture type white color LED or neutral color LED of the present invention. FIG. 5(a) is a section of the LED device.

FIG. 5(b) is a vertical section of only the LED chip. A transparent plastic mold 21 encloses a stem 22, a stem 23 and an LED chip 25. The Γ-shaped stem 22 has no cavity on a top branch 24. The top is an even plane. The ZnSe LED 25 is upside down bonded upon the even top 24 of the stem 22. The LED 25 consists of a ZnSe substrate 26 having a dopant as an SA-center and a band gap emission structure 27 (ZnSe-type thin film) epitaxially grown on the substrate 26. The epitaxial film emission structure 27 comprises a ZnSe film, a ZnCdSe film and so on. A pn-junction is formed in the epitaxial laminated films. On the film part, a wide p-electrode has been fabricated. A narrow ring-shaped or a small dot-shaped n-electrode has been made on the bottom of the substrate 26. The LED 25 is turned upside down and is bonded on the top part 24 of the stem 22 at the p-electrode. The top n-electrode is connected to the stem 23 by a wire 28. A single wire is enough for the connection between the chip and the stems. In the reverse posture type, the stem 23 is a cathode and the Γ-stem 22 is an anode.

Supplying a current from the stem 22 to the stem 23 induces the epitaxial film structure 27 to generate inherent (LED) blue rays (E) of a wavelength of from 460 nm to 510 nm by the electron transition across the band gap. All the blue rays go upward into the substrate 26. Some of the rays further progress out of the substrate as blue light. The rest of the blue rays are absorbed by the SA-centers in the substrate. The SA-center generates yellow SA-rays. The SA-rays also go upward out of the substrate 26. The LED light and the SA emission together emanate upward from the top of the LED. Two different kinds of light mix together. The mixed light seems white or neutral color for eyesight. In the upside down posture, the SA emission increases in proportion to the thickness of the substrate. It is easy to enhance the ratio of the SA-emission more than 50% in the mixture light in the upside-down posture. The reverse posture facilitates the control of the tone of white or neutral colors. However, attention should be paid to the singular relation between the cathode stem 23 and the anode Γ-shaped stem 22 reverse to the ordinary LEDs.

(3) Encapsulated reverse posture type ZnSe white color LED and ZnSe neutral color LED The reverse posture type example shown by FIG. 5(a) and FIG. 5(b) has still another drawback. The blue rays emitted from the epitaxial film emission structure 27 nearly in parallel with the surface go out of the side as inherent blue light without mixing with the SA emission. Namely, the side light seems exclusively blue. The shape of the stem (lead) is further now contrived to avoid the side blue light emission. FIG. 6(a) and FIG. 6(b) show an encapsulated reverse posture type of a white color LED or a neutral color LED. FIG. 6(a) is a section of the whole. FIG. 6(b) is a section of only the chip and the neighbor. A transparent plastic mold 31 holds a stem 32, another stem 33 and an LED chip 35 within. The structure is similar to the ordinary LEDs. The Γ-shaped stem (lead) 32 has a top portion 34 with a deep cavity 39. The ZnSe LED 35 is fixed upside-down upon the bottom of the cavity 39. The depth of the cavity 39 is larger than the height of the LED 35. An upper aperture of the cavity 39 is so narrow that the LED cannot launch rays nearly in parallel to the surface. The cavity 39 forbids the side rays.

The LED 35 includes a ZnSe substrate 36 doped with the dopant atoms which act as SA-emission centers and a (ZnSe-type film) LED emission structure 37 is epitaxially grown on the substrate 36. The LED emission structure 37 includes a ZnSe or ZnCdSe active thin layer and a pn-junction. The LED 35 is fixed upside down upon the bottom 34 of the cavity 39 of the stem 32. The film emission structure 37 has a p-electrode which is directly die-bonded upon the bottom of the stem (lead) 32. The ZnSe substrate 36 has an annular or a small dotted n-electrode on the surface. The n-electrode is connected to the other stem 33 by a wire 38. This type needs only a single wirebonding process. The stem 33 is a cathode and the stem 32 is an anode, since the LED chip is mounted in the reverse posture. An annular reflection plate 40 is mounted on the top of the cavity 39.

When a current flows across the active layer and the pn-junction, the epitaxial film emission structure 37 emits blue rays (E) of 460 nm to 510 nm by the band gap transition. All the blue rays (E) propagate upward and enter the ZnSe substrate 36. The SA-centers built by the dopant atoms absorb a part of the blue rays (E) and generate SA emission (F) ranging from 550 nm to 650 nm in wavelength. The SA-rays (F) also propagate upward together with the rest of the blue rays (E). The blue LED rays (E) mix with the SA-rays (F). The mixture seems white color or neutral color. White color or a neutral color is synthesized by the blue rays (E) and yellow or orange rays (F). All the rays going obliquely from the LED are shielded and reflected by the walls of the cavity 39. Only the rays nearly emitting normal to the chip surface can go out of the cavity 39. This encapsulated upside down type LED has strong directivity.

(4) Reverse posture substrate encapsulating type ZnSe white color LED and ZnSe neutral color LED The encapsulated type shown by FIG. 6(a) and FIG. 6(b) can cut slantingly-emitting rays. However, this type has a drawback of too strong directivity. Sometimes less directive LEDs are required. Another drawback of the encapsulated type is the complexity of the stem, which raises the cost of producing the complex stem and the cost of mounting the LED on the stem. FIG. 7(a) and FIG. 7(b) show another type of a white color LED or a neutral color LED of the present invention. This type aims at lowering directivity and suppressing the side leakage of blue light. This type gives a cavity to the substrate itself for encapsulating the epitaxial film structure within the substrate.

FIG. 7(a) shows a sectional view of the substrate encapsulating type LED. FIG. 7(b) is a section of the LED chip and the stem. Stems (leads) 42 and 43 and an LED chip 45 are buried in a transparent plastic mold package 41. The notched LED chip 45 is upside down mounted on a top 44 of the Γ-shaped stem 42. The central part of the LED 45 has a deep cavity 49. A ZnSe-type epitaxial emission structure 47 is formed on the bottom of the cavity 49. The epitaxial emission structure 47 is encapsulated by a substrate 46 itself. All the rays emitted from the epitaxial emission structure 47 must pass through some part of the substrate 46 for going out of the LED device. All the inherent blue rays have chances to be converted to the SA-rays by the ZnSe substrate 46.

There are an insulating layer 50 and an extra ZnSe layer 51 at the peripheral part of the substrate 46. The LED 45 is bonded at the extra ZnSe layer 51 on the stem (lead) surface 44. No electric current flows from the step via the extra ZnSe layer 51 due to the insulating layer 50. A protrusion 52 lies at the center of the stem surface 44. A p-electrode on the epitaxial emission strata is bonded on the protrusion 52. The p-electrode is electrically connected via the protrusion 52 to the stem (lead) 42. The bottom surface of the ZnSe substrate 46 is upside. The substrate 46 has an annular n-electrode or a small dotted n-electrode on the upside. The top n-electrode is connected by a wire 48 to the other stem 43. The stem (lead) 42 is an anode. The other stem 43 is a cathode.

When current is supplied to the LED 45, the epitaxial structure 47 emits shorter wavelength (blue or green) rays (E) between 460 nm and 510 nm. Since the epitaxial emission structure 47 is fully enclosed by the substrate 46, all the rays once pass through the substrate 46. A part of the rays go out as blue or green rays. The rest is absorbed by the substrate 46 and is converted to longer wavelength SA-rays (yellow or orange). Both the blue-green LED-rays (E) and the yellow-orange SA-rays (F) go together in the vertical direction and in the side directions. Mixture of them seems white color or neutral colors for eyesight. This type LED makes low directivity light. Low directivity gives wider applications to this type LED than the former type (3).

Apparently, the white color LED and the neutral color LED of the present invention are not different from conventional LEDs. Every LED of the present invention consists of a substrate and an epitaxial film structure. What is new is doping the substrate with dopants which act as fluorescence centers (or SA-centers). The substrate itself produces fluorescence. The present LEDs dispense with painting or potting an extra fluorescent material (or phosphor) on the LEDs. To spare an extra fluorescent material alleviates material costs, production costs and stem costs. The well-established low-cost manufacturing of conventional LEDs is available. This invention enables the ordinary LED manufacturing technologies to make white color LEDs and neutral color LEDs at low cost.

In any case, a substrate is indispensable for manufacturing an LED. When a substrate emits fluorescence, the fluorescence is deemed to be a hindrance which should be eliminated till now. This invention, however, makes the best use of the fluorescence which is generated from the substrate. Furthermore, this invention accelerates the yield of the fluorescence by doping impurities as origins of the fluorescent emission. This invention succeeds in making white color and neutral colors by adding the fluorescence of the substrate to the band gap emission at the active layer. Conventional LEDs cannot produce the white color and the neutral colors made by the present invention. The success originates from utilizing the obstacle positively.

This invention makes white color light or neutral color light by growing epitaxially ZnSe crystal or ZnSe-related compound on a ZnSe substrate doped with SA-centers, producing blue or bluegreen light by the epitaxial film structure, converting the blue or bluegreen light to yellow or orange light by the SA-centers, and mixing the blue or bluegreen light with the yellow or orange light. This invention has nothing to make white or neutral colors besides an LED chips. The n-type ZnSe this invention relies upon has higher transparency than the YAG phosphor. The higher transparency alleviates the loss of light by absorption. Furthermore, the conversion efficiency of the ZnSe substrate from blue light to yellow or orange light is higher than the YAG fluorescent material. Less absorption and higher conversion give the LEDs of the present invention higher luminosity than the prior GaInN/YAG white LED.

The present invention enjoys a long lifetime due to the ZnSe LED that is a main component of the device. Various tones of white color can be produced by changing the dopants and the dopant concentrations. Further, the white color tone can be varied from warm white to cold white only by changing the thickness of the ZnSe substrate. Unlike the GaInN/YAG white LED, this invention needs no extra fluorescent material. This invention makes the best use of the ZnSe substrate itself as the SA-emission centers. Semiconductor devices, in general, require a substrate for carrying active layers grown thereon. This invention takes advantage of the substrate as a light source of yellow or orange. The exclusion of extra parts from the LED gives this invention a simple structure and facile manufacturing.

This invention first succeeds in making a neutral color LED capable of producing redpurple, pink or bluepurple color which the conventional LEDs never produce. Such neutral colors between red and purple are quite novel for LEDs. This invention has a wide application for display, ornament and lightening.

BRIEF DESCRIPTION OF THE DRAWINGS

FIG. 1(*b*) is an enlarged section view of the chip and the fluorescent material of the GaInN/YAG LED of FIG. 1(*a*).

FIG. 3(*b*) is an enlarged sectional view of the chip and the stem of the neutral LED of FIG. 3(*a*).

FIG. 4(*b*) is an enlarged sectional view of the chip and the stem of the LED shown by FIG. 4(*a*).

FIG. 5(*b*) is an enlarged sectional view of the chip and the stem of the same LED as FIG. 5(*a*).

FIG. 6(*b*) is an enlarged sectional view of the chip and the stem of the LED shown by FIG. 6(*a*).

FIG. 7(*b*) is an enlarged section of the chip and the stem of the epi-down type LED of FIG. 7(*a*).

FIG. 18(a) is a section of a ZnSe wafer covered with a lattice-shaped mask.

FIG. 18(b) is a section of the ZnSe wafer having cavities being made by etching the ZnSe wafer through the lattice-shaped mask.

FIG. 18(c) is a section of the ZnSe wafer having epitaxially grown films on the bottoms of the cavities and the mask lines.

FIG. 18(d) is a horizontal view of the ZnSe wafer covered with the lattice-shaped mask.

FIG. 19 is epitaxially grown film strata of a neutral LED related to embodiment 7 having a ZnSe active layer.

FIG. 20 is an emission spectrum of the neutral color LED of embodiment 7 including three samples α(50 μm), β(250 μm) and γ(500 μm) having different substrate thicknesses.

FIG. 25 is epitaxially grown film strata of a neutral LED related to embodiment 9 having a ZnSe/ZnCdSe MQW active layer and an I, Al-doped ZnSe substrate.

FIG. 26 is an emission spectrum of the neutral color LED of embodiment 9 including two samples ζ(50 μm) and η(150 μm) having different substrate thicknesses.

FIG. 29 is a table for showing the materials of substrate, the wavelengths of substrate emission, the materials of active layer, the wavelengths of active layer emission, the thicknesses of substrate, embodiment symbols, and the chromaticity coordinates of embodiments 7, 8 and 9 of the neutral color LEDs.

DETAILED DESCRIPTION OF THE PREFERRED EMBODIMENTS

[EMBODIMENT 1(CVT ZnSe substrate, multiquantum well active layer, normal posture)]

Figure 13:
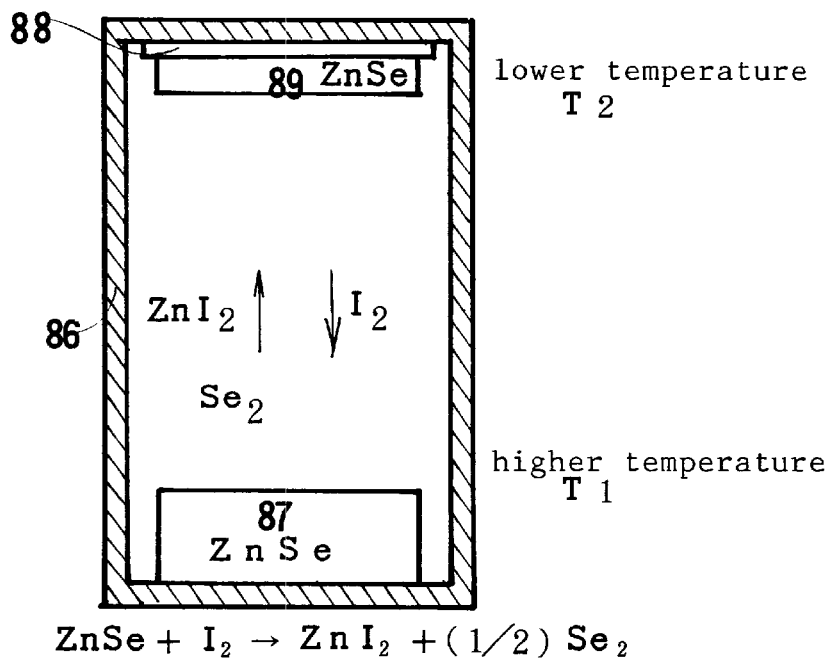
FIG. 13 is a section of a chemical vapor transport apparatus for growing a ZnSe single crystal.

Czochralski method or Bridgman method which grows a crystal from a melt cannot grow a ZnSe single crystal. Se has so large dissociation pressure at high temperatures that a ZnSe melt cannot be obtained only by heating. Ultrahigh pressure and a high temperature may be able to melt ZnSe. But it is impractical. A ZnSe crystal requires a special growing technique which dispenses with a ZnSe melt. Chemical Vapor Transport (:CVT) method and Grain-growth method are available for producing a ZnSe single crystal. The CVT method makes a ZnSe crystal by transporting Zn and Se by the action of iodine (I). Thus, the CVT method is sometimes called an "iodine transport method". This example makes a ZnSe (100) substrate by the CVT method. Since the CVT method is not a popular method, it is convenient to explain the CVT method first. FIG. 13 demonstrates the iodine transport (CVT) method. A polycrystal ZnSe 87 is laid on the bottom of a growth chamber 86. A (100) ZnSe seed crystal 88 is fixed on the ceiling of the growth chamber 86. The chamber 86 is filled with iodine (I) vapor. The bottom polycrystal ZnSe 87 is heated at a temperature T1. The ceiling seed crystal ZnSe 88 is heated at a temperature T2. T2 is lower than T1 (T2<T1). At the bottom, higher temperature T1 induces a reaction of $2ZnSe + 2I_2 \rightarrow 2ZnI_2 + Se_2$. Since $ZnI_2$ and $Se_2$ vapor, $ZnI_2$ vapor and $Se_2$ vapor rise in the chamber to the ceiling. At the ceiling, $ZnI_2$ and $Se_2$ are cooled by the seed ZnSe 88 and are converted into ZnSe by the reverse reaction of $2ZnI_2 + Se_2 \rightarrow 2ZnSe + 2I_2$. The resultant ZnSe piles upon the seed ZnSe 88 with the same orientation. Thus, a ZnSe single crystal grows upon the seed. $I_2$ vapor returns to the bottom for reacting with ZnSe again into $Zn_2$. In the cycle, iodine carries Zn from the bottom polycrystal to the ceiling single crystal. Thus, this method is called an "iodine transportation method". Otherwise, this is often called a "chemical transport method", because this method utilizes chemical reactions at the bottom and at the top. The growth temperature T2 is about 850° C., which is far lower than the melting point of ZnSe under the ultrahigh pressure.

Figure 14:
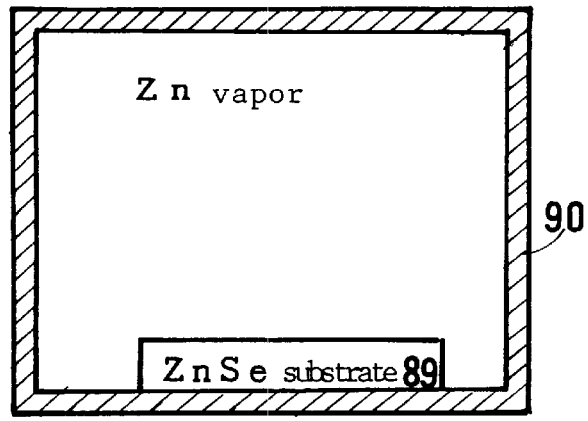
FIG. 14 is a section of an annealing apparatus for annealing the ZnSe single crystal made by the chemical vapor transport apparatus.

The ZnSe single crystal 89 has still many Se vacancies and other defects. The ZnSe crystal 89 is annealed in an apparatus 90 of FIG. 14. The annealing is done by heating the ZnSe single crystal 89 up to about 1000° C. in zinc (Zn) vapor atmosphere and maintaining the ZnSe for about 50 hours. Then, the ZnSe is cooled at a rate of 60° C./min. An improved ZnSe single crystal is obtained.

The annealed ZnSe was intentionally doped with no dopant. But the iodine $I_2$ which carries zinc from the bottom ZnSe to the top ZnSe is naturally absorbed in the ZnSe in the growing process. The annealing activates the $I_2$ to an n-type dopant in the ZnSe. The carrier (electron) concentration is approximately $5 \times 10^{17}$ cm$^{-3}$ to $1 \times 10^{18}$ cm$^{-3}$ in the n-type ZnSe. The ZnSe substrate is about 400 μm thick.

Figure 15:
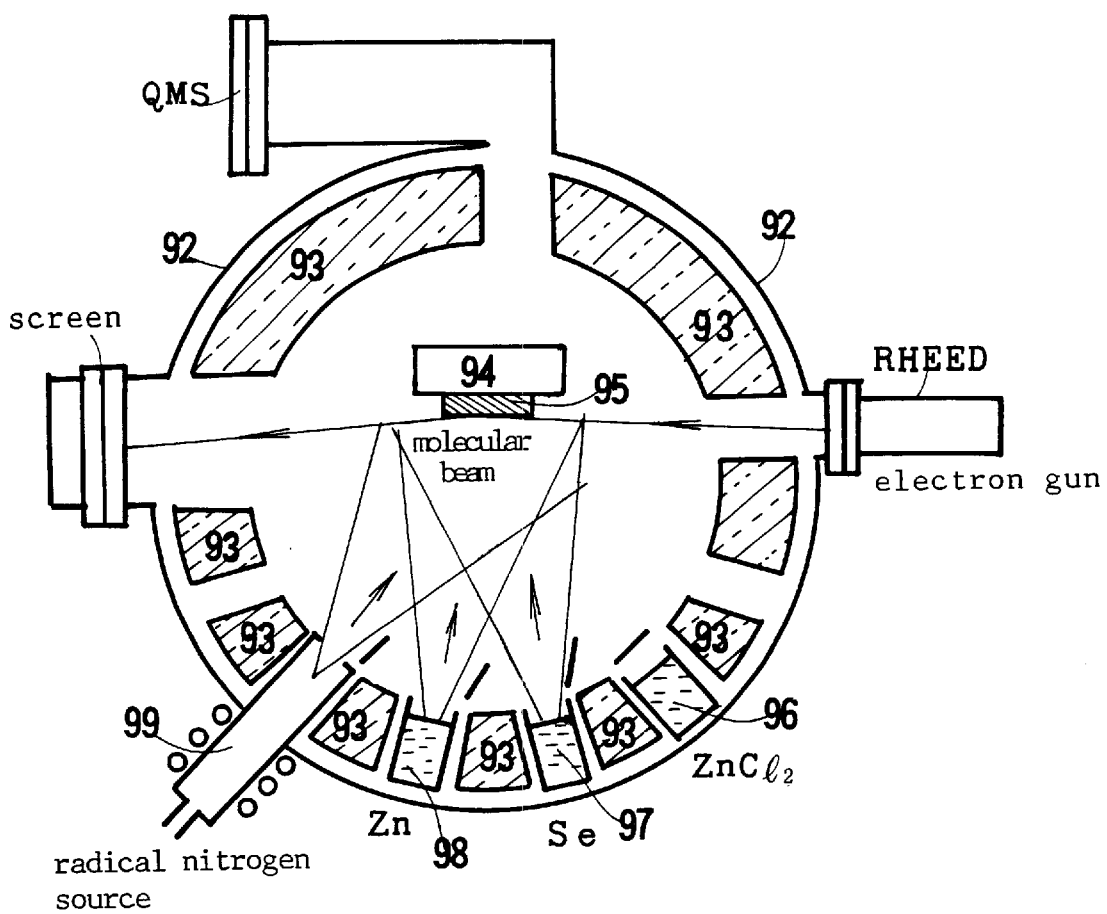
FIG. 15 is a sectional view of a molecular beam epitaxy apparatus for growing an epitaxial film structure on the ZnSe substrate.

Then an epitaxial emission structure is grown on the ZnSe substrate by an MBE (molecular beam epitaxy) method. FIG. 15 exhibits an MBE apparatus which is employed in the present embodiment. An MBE chamber 92 is a vacuum chamber which can be evacuated up to ultrahigh vacuum. Liquid nitrogen shrouds 93 are installed in the MBE chamber 92 for adsorbing gas molecules on cooled shroud walls in order to heighten vacuum. At least two kinds of vacuum pumps are provided to the chamber 92 for pumping the chamber 92 up to ultrahigh vacuum of about $10^{-8}$ Pa. The MBE chamber 92 has a sample holder 94 for keeping a ZnSe substrate wafer 95. The sample holder 94 has a heater (not shown) for heating and keeping the sample wafer at a pertinent temperature. A plurality of molecular beam cells (MB-cells or K-cells) 96, 97 and 98 with apertures are arranged at the bottom of the chamber 92. The top apertures of the cells are directed to the substrate wafer 95. FIG. 15 shows only a zinc chloride (ZnCl$_2$) MB-cell 96, a selenium (Se) MB-cell 97 and a zinc (Zn) MB-cell 98.

In addition, the MBE chamber 92 has a Cd MB-cell, an Mg MB-cell, an S MB-cell(ZnS) and a Te MB-cell for making compound crystals of cladding layers and active layers. The ZnCl$_2$ cell 96 is required for doping chlorine (Cl) into the films. Cl is an n-type dopant for the epitaxial films. The Zn cell 98 and the Se cell 97 are indispensable for making ZnSe films and parts of other ZnSe-type films of active layers and cladding layers. The MB-cell has a PBN (pyrolitic boron nitride) crucible, a heater enclosing the crucible, a suspending device for maintaining the crucible and the heater, a thermocouple, a shutter and a flange for sustaining the parts. The heater heats a solid material into a melt in the PBN crucible. A part of the melt is evaporated into molecular beams. The molecular beams fly toward the ZnSe wafer 95. Some material is directly sublimed from solid to vapor into molecular beams. Supply of nitrogen requires a radical cell 99 of N$_2$. Since nitrogen is not a solid but inherently a gas, the ordinary MB cell is unavailable. Nitrogen is an inactive gas consisting of nitrogen molecules N$_2$. If nitrogen molecules were supplied to the heated substrate, no reaction would take place. The nitrogen radical cell 99 converts nitrogen molecules into nitrogen plasma including nitrogen atoms or nitrogen molecule radicals which are in excited states by electric discharge. Nitrogen is necessary as a p-type dopant for the epitaxial films. ZnSe or ZnSe-type films are epitaxially grown on the ZnSe wafer 95 in succession by launching molecular beams from the MB-cells to the wafer. The growth temperature of the epitaxial films on the ZnSe wafer 95 is about 275° C. to 325° C. The ratio of the supplied 6th group element (Se, S) to the supplied 2nd group element is 1 to 5. The growth rate is about 0.4 μm/H to 0.7 μm/H.

Figure 8:
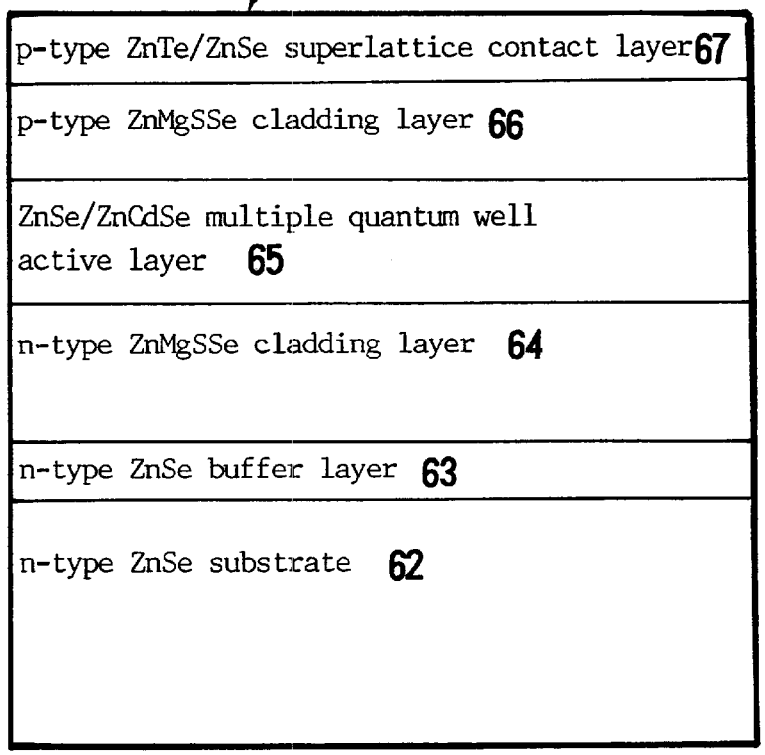
FIG. 8 is film strata of an epitaxial ZnSe wafer related to embodiment 1 having a multiple quantum well ZnSe/ZnCdSe active layer.

FIG. 8 denotes strata of a epitaxial growth structure 60. An n-type ZnSe buffer layer 63, an n-type ZnMgSSe cladding layer 64, a ZnSe/ZnCdSe multiquantum well active layer 65, a p-type ZnMgSSe cladding layer 66 and a p-type ZnTe/ZnSe superlattice contact layer 67 are successively grown on an n-type ZnSe substrate 62. The following (1) to (6) are further detailed components of the epitaxial layers and the substrate from the bottom to the top.

(1) n-type ZnSe substrate 62 (I-dope; 400 μm thick)
(2) n-type ZnSe buffer layer 63 (Cl-dope)
(3) n-type Zn$_{0.85}$Mg$_{0.15}$S$_{0.10}$Se$_{0.90}$ cladding layer 64 (Cl-dope)
(4) multiquantum well active layer 65=five fold strata of a unit of a 10 nm thick ZnSe film and a 5 μm thick Zn$_{0.88}$Cd$_{0.12}$Se film
(5) p-type Zn$_{0.85}$Mg$_{0.15}$S$_{0.10}$Se$_{0.90}$ cladding layer 66 (N-dope)
(6) p-type ZnTe/ZnSe superlattice contact layer 67.

When ZnSe film is taken as an active layer, 460 nm light emission is produced by the electron band gap transition. 460 nm corresponds to the band gap of ZnSe exactly on the relation λ=hc/Eg where λ is 460 nm of wavelength, h is Planck's constant, c is the light velocity and Eg is the band gap energy. ZnCdSe is a compound of CdSe and ZnSe. ZnCdSe has a smaller band gap than ZnSe. The decrement is roughly in proportion to the ratio of CdSe. If an active layer is made by a compound ZnCdSe, the electron band gap transition can produce light of a wavelength longer than 460 nm. ZnSe and ZnCdSe have different lattice constants. If a single ZnCdSe layer were to be employed as an active layer, the difference of the lattice constants would induce lattice misfitting. To suppress the occurrence of the lattice relaxation, a superlattice structure is chosen for the active layer. The active layer ZnCdSe includes 0.12 of Cd and 0.88 of Zn as the 2nd group element. The ZnCdSe active layer has a smaller band gap corresponding to 490 nm in wavelength than 460 nm of ZnSe. Another ratio of Cd can be selected as an active layer unless the active layer induces the lattice relaxation.

The p-cladding layer 66 is doped with nitrogen (N). The n-cladding layer 64 is doped with chlorine (Cl). The ZnMgSSe cladding layers 64 and 66 have a wider band gap than the active layer 65. The wider band gap of ZnMgSSe excludes the carriers from the cladding layers 64 and 66 to the active layer 65. The components of the cladding layers are determined by the conditions of a similar lattice constant to ZnSe and a wider band gap than the active layer. Nitrogen (N) is employed as a p-type dopant and chlorine (Cl) is employed as an n-type dopant in all the epitaxial films.

Figure 4A:
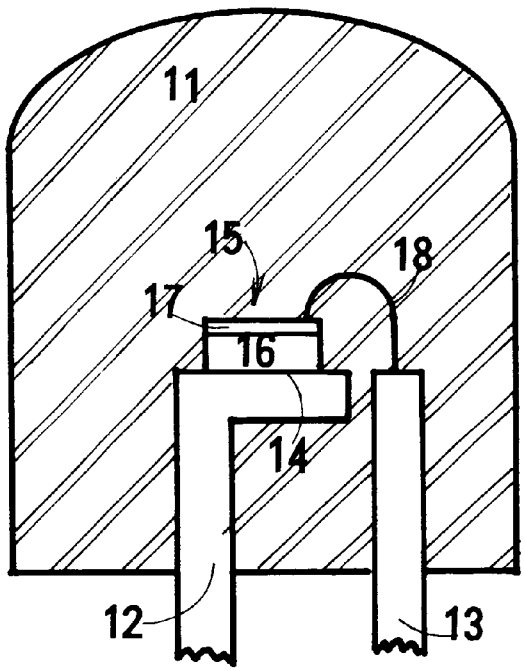
FIG. 4(*a*) is a sectional view of a white color LED related to embodiments 1 and 2 of the present invention in a normal posture (epi-up).
Figure 4B:
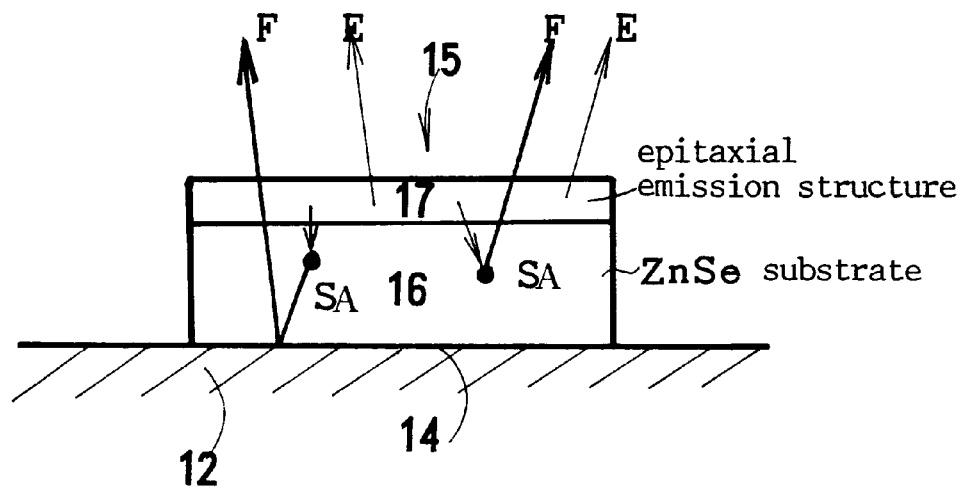

A p-electrode of Pd/Au (palladium/gold) is formed upon the p-type ZnTe/ZnSe superlattice contact layer 67 of the epitaxial wafer. An n-electrode of In (indium) is formed upon the bottom surface of the ZnSe substrate 62. Ti/Au (titanium/gold) can be adopted as an n-electrode on the ZnSe substrate 62 instead of In. Photolithography can produce electrode patterns on the wafer. The wafer having electrode patterns is cut into a plenty of square chips of 300 μm×300 μm. The chip is mounted on a stem 14 of a lead 12 with the n-electrode down and the p-electrode up, as shown in FIG. 4(a). The ZnSe substrate 62 is contacted with the stem 14. The top p-electrode is connected to another lead 13 by a wire 18. The chip, the stem and the leads are molded with a transparent plastic 11 into a dome-shape. LEDs are fabricated.

Figure 9:
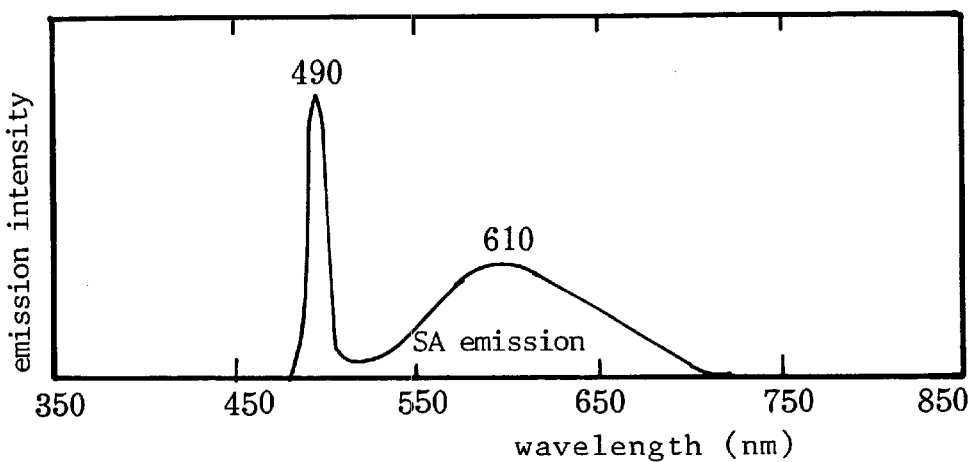
FIG. 9 is an emission spectrum of embodiment 1 having a ZnSe/ZnCdSe MQW active layer.

These LEDs are driven in a constant current mode. The LEDs emit high luminosity white light. The white light power is 1.5 Cd for a driving current of 20 mA. FIG. 9 is an emission spectrum of the LED. A sharp peak at 490 nm denotes the LED (band gap) emission from the epitaxial emission structure. Another broad peak at 610 nm originates from the SA-emission from the ZnSe substrate. White light is synthesized from both the 490 nm LED emission and 610 nm SA-emission. The synthesized light is yellowish white.

[EMBODIMENT 2 (Grain-growth ZnSe substrate, single quantum well or double hetero active layer, normal posture)

The former embodiment started from the CVT (Chemical Vapor Transport=iodine transport)-made ZnSe substrate. There is another growing method called grain-growth method for the growth of a ZnSe single crystal. The grain-growth method utilizes neither chemical reaction nor transportation. The grain-growth method converts a polycrystal ZnSe to a single crystal ZnSe by heating a part of the polycrystal for facilitating the movement of grain walls in the polycrystal, and inducing the enlargement of a single grain size. Small grains move, rotate to the same orientation as the dominant grain, and merge to the dominant grain together. Finally, all the grains are unified into a single grain by the annealing. Dispensing with iodine (I) as a carrier of Zn, the grain-growth method can make a purer ZnSe single crystal. The ZnSe crystal is cut into thin ZnSe wafers. Aluminum is doped to the ZnSe by annealing in the atmosphere including Al. Aluminum gives the n-type conduction to the ZnSe crystal. The carrier concentration is $5\times10^{17}$cm$^{-3}$ to $1\times10^{18}$ cm$^{-3}$.

Figure 10:
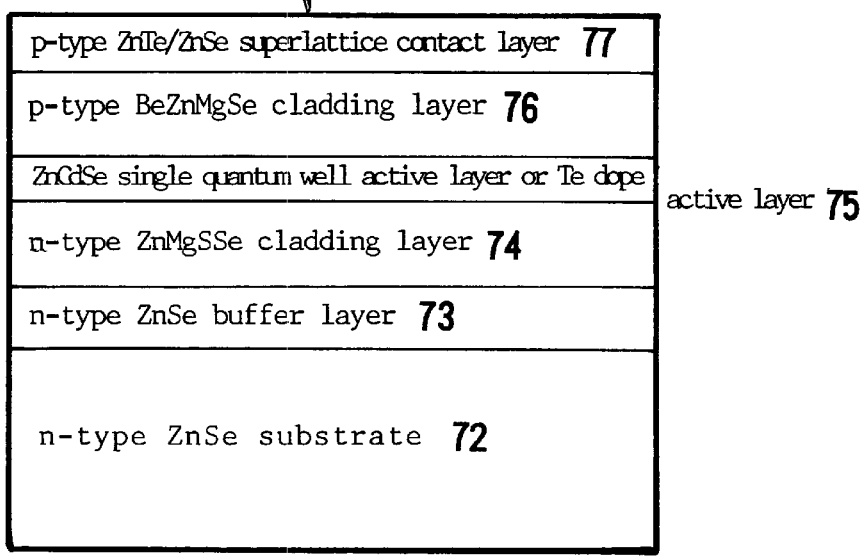
FIG. 10 is film strata of an epitaxial ZnSe wafer related to embodiment 2 having a ZnCdSe single quantum well active layer or a Te-doped ZnSe active layer.

Film strata shown in FIG. 10 are grown on an Al-doped n-ZnSe substrate wafer 95 by the MBE apparatus in FIG. 15. An n-type ZnSe(zinc selenide) buffer layer 73, an n-type ZnMgSSe cladding layer 74, a ZnCdSe single-quantum well active layer 75, a p-type BeZnMgSe cladding layer 76 and a p-type ZnTe/ZnSe superlattice contact layer 77 are epitaxially grown on the n-type ZnSe single crystal substrate 72, which is in correspondence with the ZnSe substrate wafer 95 shown in FIG. 15. An alternative of the active layer 75 is a Te-doped ZnSe active layer. Detailed components of the epitaxial film strata are shown from the bottom to the top as follows.

(1) n-type ZnSe substrate 72 (Al-dope: grain-growth method; 300 $\mu$m)

(2) n-type ZnSe buffer layer 73 (Cl-dope)

(3) n-type $Zn_{0.85}Mg_{0.15}S_{0.10}Se_{0.90}$ cladding layer 74 (Cl-dope)

(4) $Zn_{0.92}Cd_{0.08}Se$ monoquantum well active layer 75 or Te-doped ZnSe active layer (5) p-type $Be_{0.20}Zn_{0.60}Mg_{0.20}$ Se cladding layer 76 (N-dope)

(6) p-type ZnTe/ZnSe superlattice contact layer 77 (N-dope)

The active layer 75 is a ZnCdSe layer including a Cd ratio of 0.08 or a ZnSe layer doped with Te (tellurium). In any case, the active layer has a 477 nm band gap. The active layer produces 477 nm light by the band gap transition. In the film strata, the p-type dopant is nitrogen (N) and the n-type dopant is chlorine (Cl) like embodiment 1. The ZnSe substrate 72 has a thickness of 300 $\mu$m. A p-electrode of Pd/Au (palladium/gold) is formed upon the p-type ZnTe/ZnSe superlattice contact layer 77. An n-electrode is formed on the bottom surface of the n-ZnSe substrate 72. The wafer is cut into a plurality of LED chips. The LED is made by mounting the chip on a stem, connecting a top electrode to the other stem(lead), and molding the chip and the stem with transparent plastic.

Figure 11:
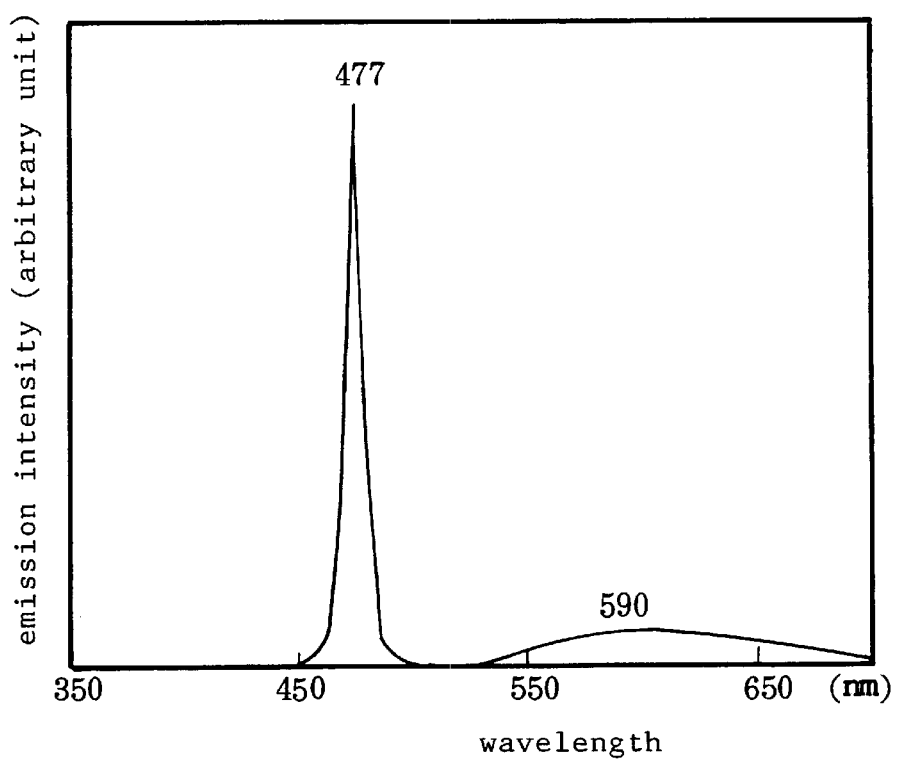
FIG. 11 is an emission spectrum of embodiment 2 having a ZnCdSe SQW active layer or a Te-doped ZnSe active layer.

A current is supplied to the LED. The LED emits light of 1.5 Cd at a driving current of 20 mA. The luminosity is equal to embodiment 1. FIG. 11 is an emission spectrum of the LED of embodiment 2. There is a strong peak at 477 nm which corresponds to the band gap transition emission of ZnCdSe or Te doped ZnSe active layer 75. There is a broad peak of 590 nm which is an SA-emission from the Al-doped ZnSe substrate 72. The spectrum is the superposition of the 477 nm peak and the 590 nm peak. The light is bluish white.

[EMBODIMENT 3 (Al-doped grain-growth ZnSe; ZnSe active layer; reverse posture, three thicknesses of 100 $\mu$m, 300 $\mu$m and 700 $\mu$m)

An Al-doped ZnSe single crystal is produced by the grain-growth method. The ZnSe crystal is cut into a 300 $\mu$m thick wafer and a 700 $\mu$m thick wafer. The wafers are annealed. The carrier (electron) density is heightened to about $5 \times 10^{17}$ cm$^{-3}$ to $1 \times 10^{18}$ cm$^{-3}$. An epitaxial film structure of FIG. 8 similar to embodiment 1 is formed on the Al-doped ZnSe wafer by the MBE apparatus of FIG. 15. The epitaxial film strata of embodiment 3 are, (1) n-type ZnSe substrate 62 (Al-dope; 300 $\mu$m thick and 700 $\mu$m thick)

(2) n-type ZnSe buffer layer 63 (Cl-dope)

(3) n-type $Zn_{0.85}Mg_{0.15}S_{0.10}Se_{0.90}$ cladding layer 64 (Cl-dope)

(4) multiquantum well active layer 65=five fold strata of a unit of a 10 nm thick ZnSe film and a 5 nm thick$Zn_{0.88}Cd_{0.12}Se$ film (5) p-type $Zn_{0.85}Mg_{0.15}S_{0.10}Se_{0.90}$ cladding layer 66 (N-dope)

(6) p-type ZnTe/ZnSe superlattice contact layer 67.

Figure 5A:
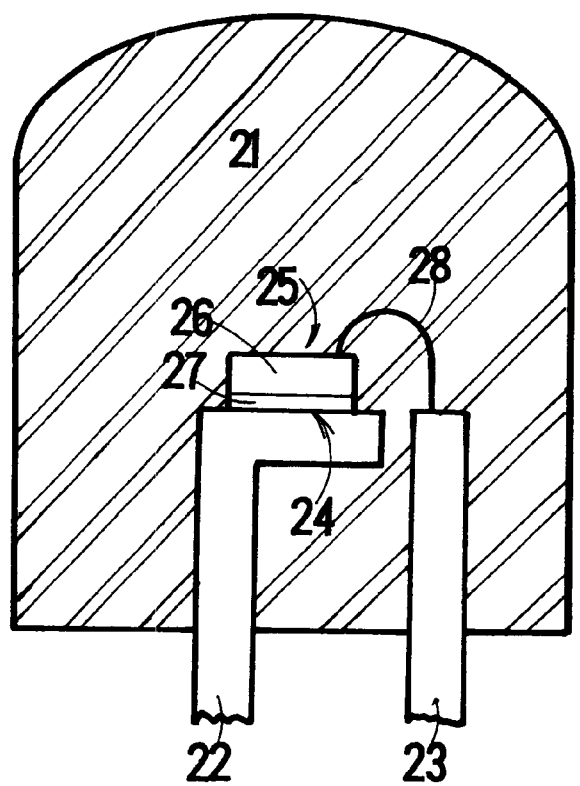
FIG. 5(*a*) is a sectional view of a white color LED related to embodiment 3 of the present invention in an inverse posture (epi-down).
Figure 5B:
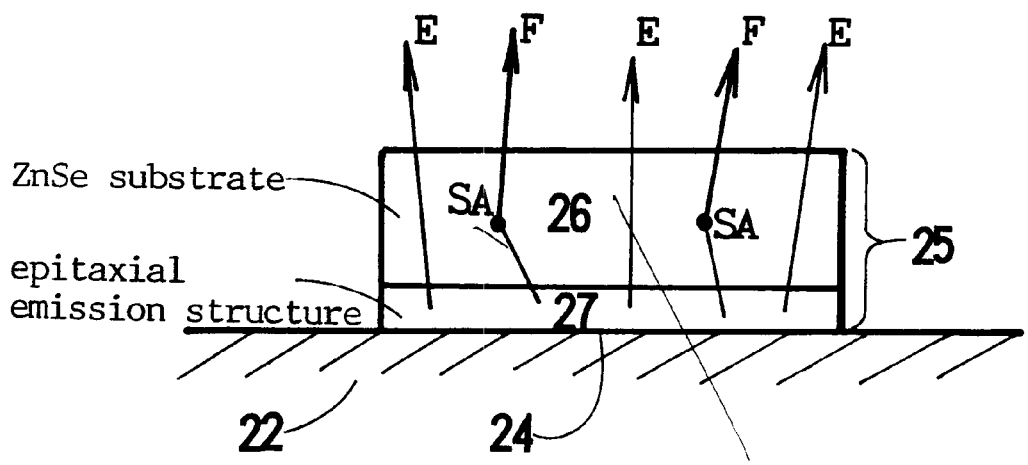

Some of the 300 $\mu$m thick epitaxial wafers are thinned into 100 $\mu$m thick wafers by polishing the bottom surface. Three kinds of epitaxial wafers with 100 $\mu$m, 300 $\mu$m and 700 $\mu$m thicknesses are prepared. P-electrodes and n-electrodes are formed on the wafers. The wafers are cut into a lot of square chips of 300 $\mu$m×300 $\mu$m like embodiments 1 and 2. The chip 25 is mounted upside down upon a stem 24 of a lead 22 as shown in FIG. 5(a). The bottom p-electrode is directly in contact with a stem 24. The top n-electrode is connected to a lead 23 by a wire 28. The normal posture LEDs of embodiments 1 and 2 are suffering from the non-uniformity of tones of the rays according to the angle. However, the epi-side down (reverse or upside down) posture of embodiment 3 enables the LED to make a uniform emission. As shown in FIG. 5(b), all the rays emitted from a epitaxial emission structure 27 pass through a substrate 26. The absorption is uniform for all directions. The luminosity of the epi-down LED is 1.5 Cd to 2 Cd for 20 mA. White light is produced by the three kinds of LEDs. But the tones of the white are different.

Figure 12:
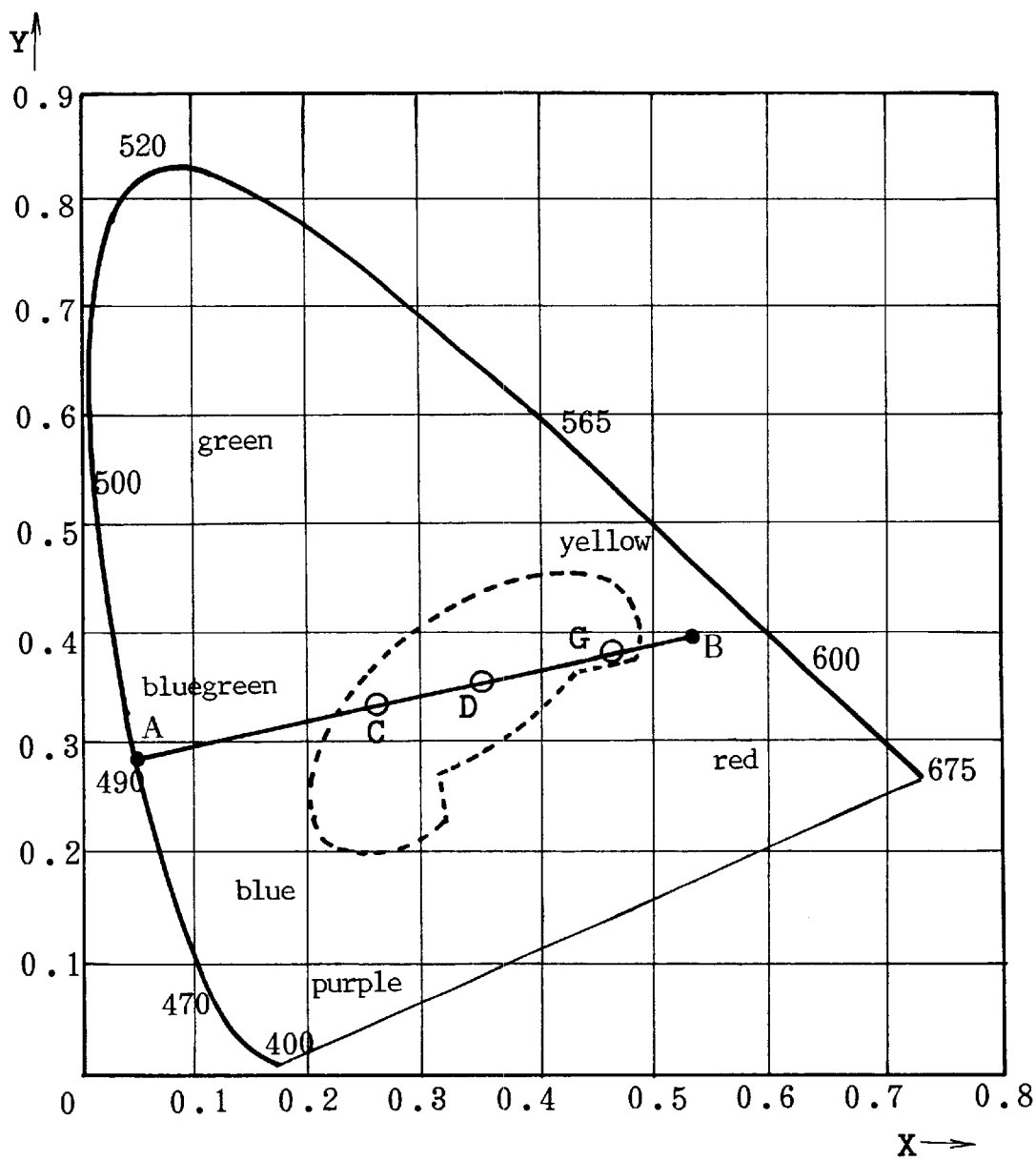
FIG. 12 is a chromaticity diagram of embodiment 3 including three samples (C, D and G) having different substrate thicknesses.

The 100 $\mu$m thick LED emits bluish cold white light. The 300 $\mu$m thick LED produces pure white light. The 700 $\mu$m thick LED makes yellowish warm white. White includes various tones from bluish cold white to yellowish warm white. Words cannot discriminate the subtle differences among the tones of whiteness. Then, it is convenient to use a chromaticity diagram for discriminating the whiteness tones. FIG. 12 is a chromaticity diagram for embodiment 3. When two points P and Q are assigned to two colors in the diagram, any color which is produced by mixing color P and color Q can be designated by a point on the line PQ. The chromaticity diagram enables us to prophesy the color produced by mixing two colors.

In FIG. 12, point A of 490 nm on the horsehoof monochromatic locus denotes the inherent emission from the epitaxial (ZnSe/ZnCdSe) film structure. Point B is the SA-emission of 630 nm by the Al-doped ZnSe substrate. Any mixture colors lie on line AB. Line AB crosses the white color region enclosed by the dotted line. Some mixture colors can be white. Point C (bluish white) denotes the emission from the 100 $\mu$m thick LED. Point D (pure white) denotes the emission from the 300 $\mu$m thick LED. Point G (yellowish white) shows the emission from the 700 $\mu$m thick LED. The lights emitted from the three LEDs are white. But the white lights have different tones of from bluish cold white to yellowish warm white in proportion to the thickness of the substrate. Colors are sometimes represented by color temperature (K) which is the temperature of a Planckian radiator having the same chromaticity coordinate as the color. The Planckian radiator means a black body radiator. Point C of the 100 $\mu$m LED is cold white having a color temperature of 8000 K. Point B of the 300 $\mu$m LED is pure white having a color temperature of 5000 K. Point G of the 700 $\mu$m LED is warm white having a color temperature of 3000 K.

The increase of the substrate thickness enhances the ratio of yellow and lowers the color temperature by raising the number of SA-centers. Embodiment 3 confirms the fact that the tone of white depends upon the thickness of the ZnSe substrate through a change of the number of SA centers. Instead of changing the substrate thickness, the dopant concentration in the ZnSe substrate can also change the tone of white.

[Embodiment 4 (Reverse posture, reflection plane, ZnSe/ZnCdSe active layer)]

Figure 6A:
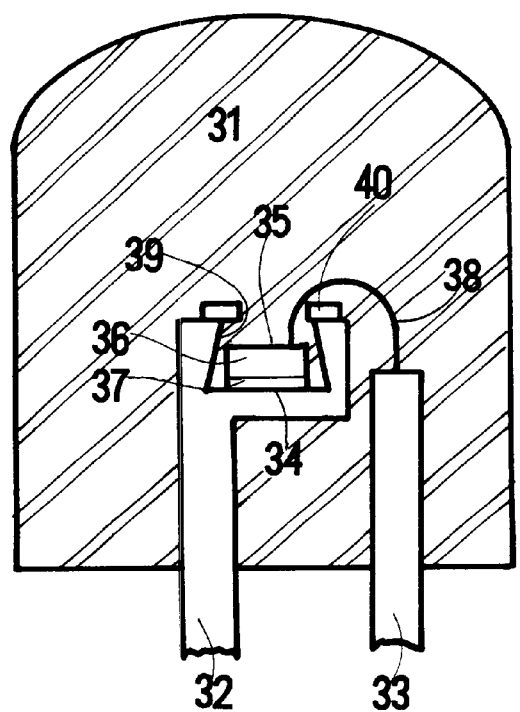
FIG. 6(*a*) is a sectional view of a white color LED related to embodiment 4 of the present invention which mounts an LED chip on the bottom of a cavity of a stem.
Figure 6B:
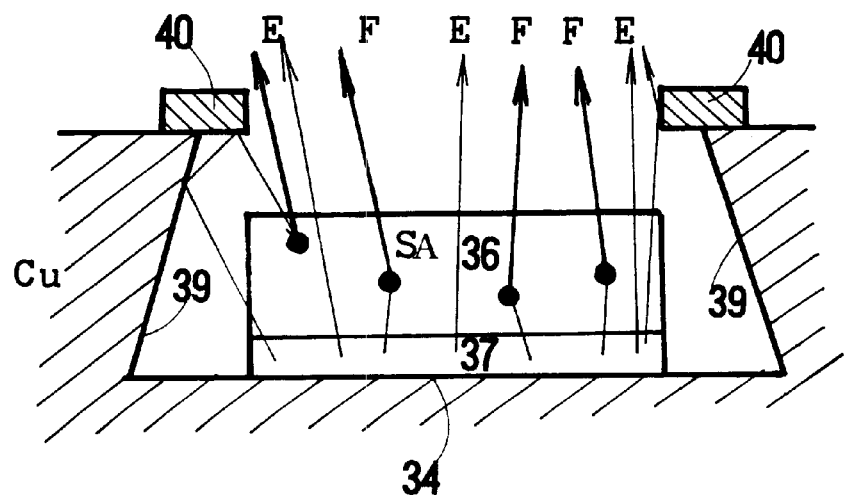

Embodiment 3 fixed the LED upside down on the stem. As long as man looks down the LED, the LED light seems uniform white. There is, however, a narrow scope of angle at which the LED denotes only blue in the side direction. To vanish the side leaking blue, embodiment 4 mounts the LED chip in a cavity. In FIG. 6(a), a stem 34 has a deep cavity 39. An LED 35 is mounted upside down on the bottom of the cavity 39. All the rays emanating in side directions are shielded and reflected by the walls of the cavity 39. A reflection ring 40 restricts the aperture of the cavity. The cavity 39 allows only the upward rays to go out of the LED 35. The upward rays never fail in passing a ZnSe substrate 36. The blue rays always mix with the yellow SA-rays for synthesizing white. Embodiment 4 proposes an excellent white LED with uniform tone and high directivity. The surface of the stem 34 is mirror-polished. The reflection ring 40 is made from an aluminum plate. The reflection ring 40 and the cavity 39 reinforce the emission power by guiding blue light to the substrate 36 for making the SA-emission. The luminosity is heightened to about 1.8 Cd to 2.5 Cd due to the reflection ring 40 and the cavity 39. The directivity is also raised by the cavity, which is higher than that of embodiment 3.

[EMBODIMENT 5: Reverse posture; cavity-LED]

Embodiment 4 places the LED upside down upon the bottom of the cavity dug in the stem. Since all rays are converged to the vertical direction due to the function of the cavity, embodiment 4 enjoys high luminosity and strong directivity. Manufacturing such a deep cavity in the stem is difficult. The difficult step raises the cost of stem. It is more convenient to form anisotropy on chips than on stems. Wafer process can give arbitrary anisotropy on a plenty of chips at a stroke, which differs from stems.

Figure 7A:
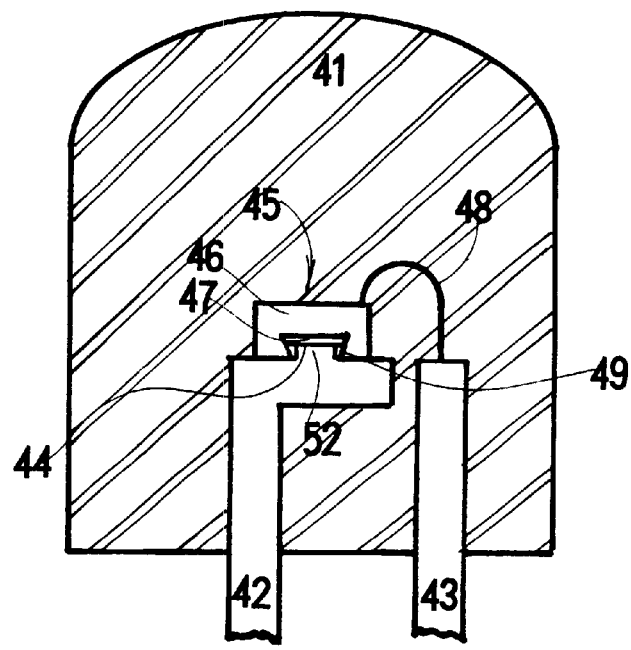
FIG. 7(*a*) is a sectional view of a white color LED related to embodiment 5 of the present invention which mounts a cavity-carrying LED chip upon a stem having a protrusion upside down (epi-down).
Figure 7B:
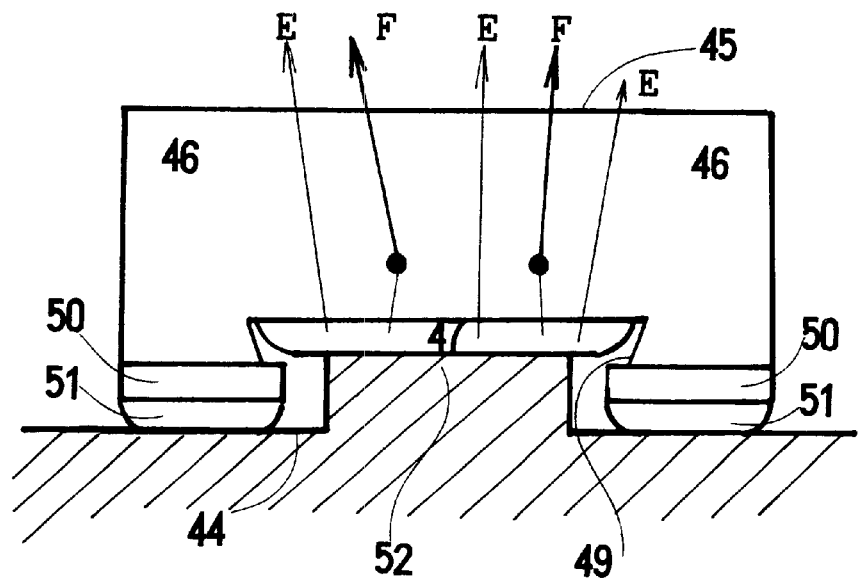

Embodiment 5 aims at more inexpensive anisotropy for converging rays and for annihilating the side leak of blue light. FIG. 7(a) and FIG. 7(b) show embodiment 5 which gives a cavity structure to a chip instead of a stem. FIG. 18(a), FIG. 18(b), FIG. 18(c) and FIG. 18(d) demonstrate the steps of making the LED chips. A lattice-shaped SiN mask pattern 80 is formed on a ZnSe wafer 78, as shown in FIG. 18(d). Although FIG. 18(d) shows only 12 chips, an actual wafer includes hundreds or thousands of chips. Blank squares 79 are exposed parts of the wafer 78. Hatched parts are the SiN mask 80. FIG. 18(a) is a section of the masked wafer. The masked lines will be boundaries of the chips. The wafer 78 is etched through the mask 80, as shown in FIG. 18(b). The exposed squares 79 are dug into cavities 83 of an about 3 $\mu$m depth. The masked part 81 survives in an inverse-mesa shape. The bottoms 82 of the cavities 83 are even.

The epitaxial films 84 of FIG. 8 are grown on the ZnSe wafer 78 having the cavities 83 and the masked inverse-mesas 81 by the MBE apparatus of FIG. 15. The epitaxial film strata 84 are the same as embodiment 1. The epitaxial films 84 are deposited on the bottoms 82 of the cavities 83, as shown in FIG. 18(c). Similar film strata 85 are non-epitaxially formed also upon the masks 80. The film strata 85 are unnecessary parts. Electrodes are formed on the inner epitaxial film strata 84 and on the bottom of the wafer 78. The wafer 78 is cut along the mask lines into a plenty of square chips of 300 $\mu$m×300 $\mu$m. The chip has the top cavity 83 and the epitaxial emission structure at the center. A small project 52 is formed on a stem 44 of a lead 42.

A chip 45 is fitted upside down on the stem 44 with an epitaxial film structure 47 in contact with the project 52 of the stem 44, as shown in FIG. 7(a) and FIG. 7(b). An n-electrode is connected to another lead 43 by a wire 48. The chip 45, the stem 44 and the leads 42 and 43 are enclosed and sealed by a transparent plastic mold package 41. When a current is supplied, the epitaxial film structure 47 emits blue or bluegreen rays (E). The SA-centers in a ZnSe substrate 46 absorb the blue or bluegreen rays (E) and convert (E) into yellow rays (F). The mixture of blue rays (E) and yellow rays (F) emanates from the LED 45 as white light. The epitaxial film emission structure 47 is fully enclosed by the ZnSe substrate 46. There is no blue light leak. The LED 45 emits uniform white light in all directions. Directivity is suppressed. Although the stem 44 is slightly processed in embodiment 5, the contrivance does not raise cost of stems. Embodiment 5 has weak dependence of luminosity upon the direction. Owing to the wide aperture angle, embodiment 5 is suitable for displays.

[EMBODIMENT 6 (Iodine transportation (CVT)-made ZnSe substrate, monoquantum-well active layer, normal posture, three thicknesses of substrate]

Figure 16:
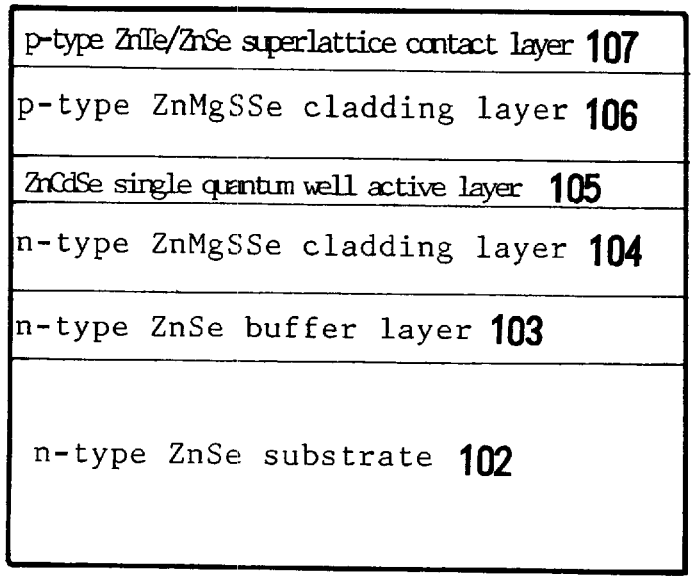
FIG. 16 is epitaxially grown film strata related to embodiment 6 having a ZnSe single quantum well active layer.

A single crystal ZnSe is grown by the iodine transportation method (chemical transport method :CVT). The ZnSe crystal includes iodine atoms (I atoms) which act as n-type dopants by replacing Se atoms. The ZnSe single crystal is cut into 300 $\mu$m-thin wafers in thickness. The wafers are n-type ZnSe having a carrier (electron) density of $5 \times 10^{17}$ cm$^{-3}$ to $1 \times 10^{18}$ cm$^{-3}$. The details of the strata are shown in FIG. 16.

(1) n-type ZnSe substrate 102 (I-dope: CVT method; 300 $\mu$m)

(2) n-type ZnSe buffer layer 103 (Cl-dope)

(3) n-type $Zn_{0.85}Mg_{0.15}S_{0.10}Se_{0.90}$ cladding layer 104 (Cl-dope)

(4) $Zn_{0.90}Cd_{0.10}Se$ monoquantum well active layer 105

(5) p-type $Zn_{0.85}Mg_{0.15}S_{0.10}Se_{0.90}$ cladding layer 106 (N-dope)

(6) p-type ZnTe/ZnSe superlattice contact layer 107 (N-dope)

Figure 1A:
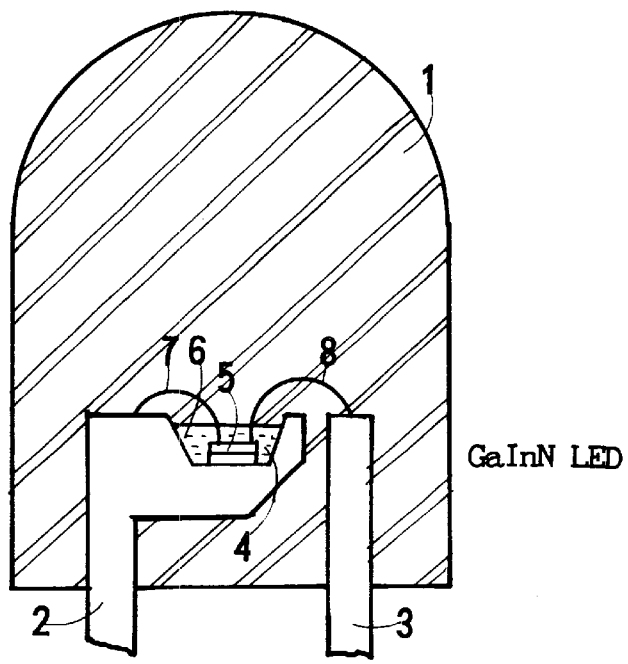
FIG. 1(*a*) is a sectional view of a prior art GaInN/YAG white color LED which is made by assembling a GaN-type LED and a YAG phosphor.
Figure 1B:
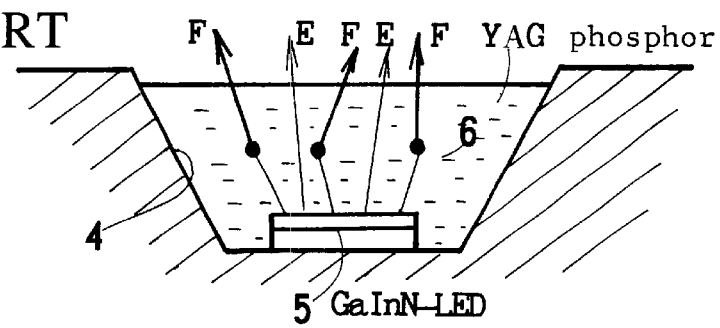
Figure 2:
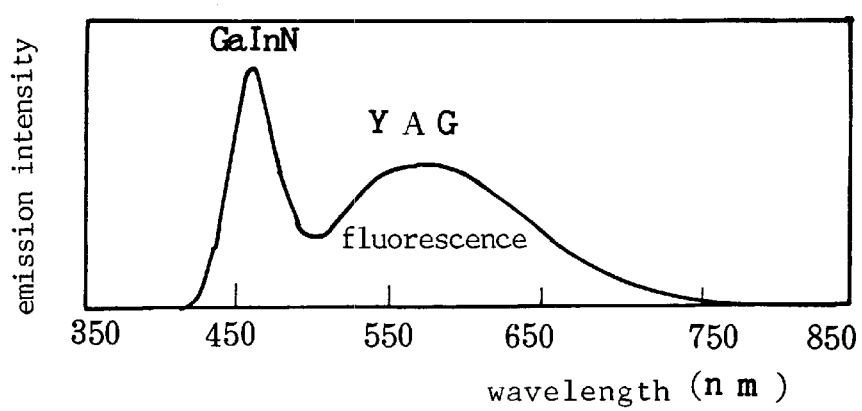
FIG. 2 is an emission spectrum of the prior art GaInN/YAG LED. The abscissa is the wavelength of light and the ordinate is the emission intensity of light (in an arbitrary unit).
Figure 3A:
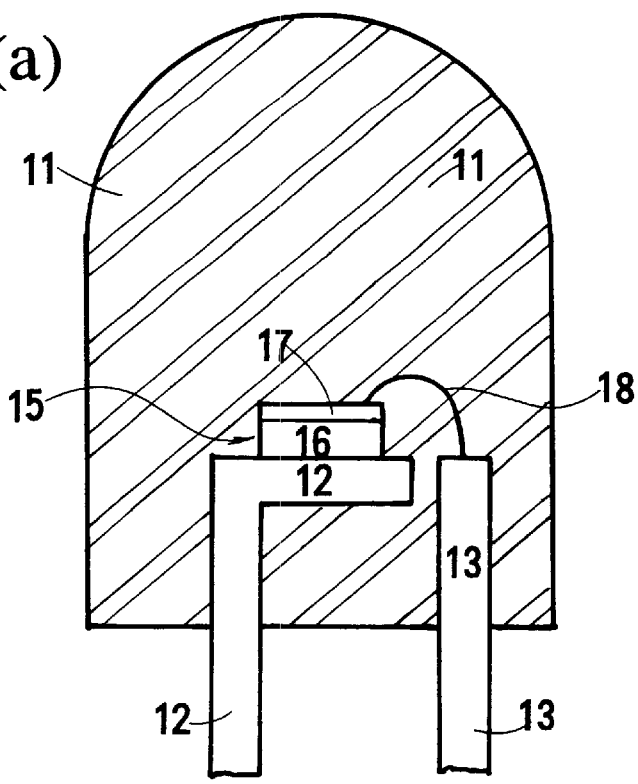
FIG. 3(*a*) is a sectional view of a neutral color LED of the present invention in a normal posture (epi-up).
Figure 3B:
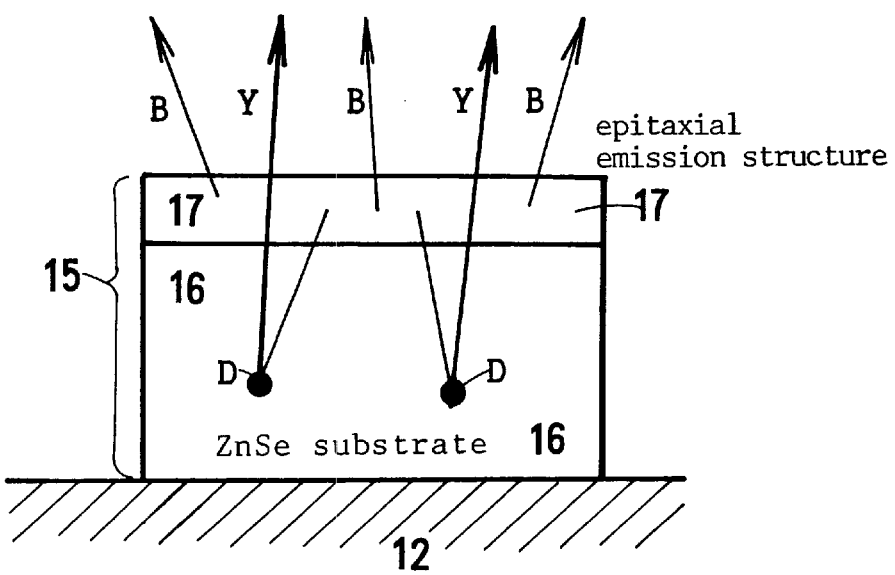

The active layer is a single quantum well of ZnCdSe including 0.10 of Cd which produces 480 nm blue light. Each rear surface of the 300 $\mu$m thick wafers is polished for thinning the wafers to 30 $\mu$m, 100 $\mu$m and 250 $\mu$m thicknesses. Three kinds of wafers are scribed into chips. LEDs are produced by mounting the chips on stems, wirebonding top electrodes and molding the chips and the stems. LEDs similar to embodiment 1 are made as shown in FIG. 3(a). The LEDs emit white light when they are driven in a constant current mode. The luminosity is 1.5 Cd to 2.0 Cd for 20 mA. The tones of white are different for three kinds of the LEDs.

Figure 17:
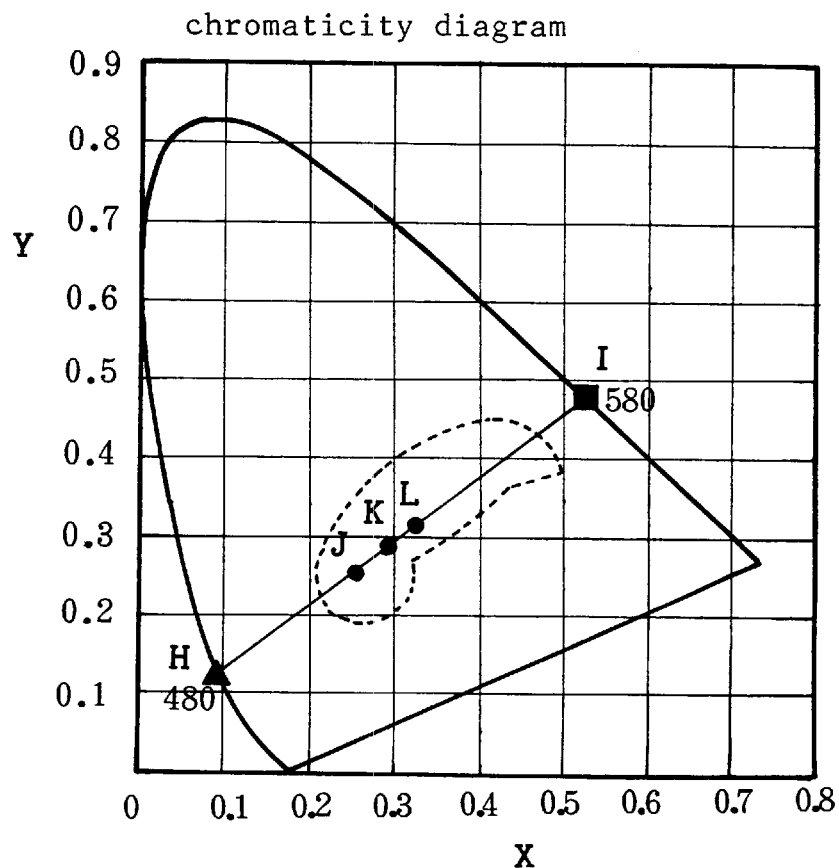
FIG. 17 is a chromaticity diagram of embodiment 6 including three samples J (30 μm), K(100 μm) and L (250 μm) having different substrate thicknesses.

The 30 $\mu$m thick LED produces bluish cold white. The 100 $\mu$m thick LED emits slightly bluish white. The 250 $\mu$m thick LED makes pure white. FIG. 17 is a chromaticity diagram for three kind LEDs of embodiment 6. In FIG. 17, point H denotes the 480 nm blue light from the epitaxial film structure. Point I designates the 580 nm SA emission induced in the CVT-ZnSe substrate by the blue light.

The colors made by all the LEDs align on the line HI connecting point H and point I. Point J denotes the light that the 30 $\mu$m thick LED emits. Point K is the color of the 100 $\mu$m thick LED. Point L is the color of the 250 $\mu$m thick LED. All the points J, K and L exist within the white region enclosed by the dotted line. Three colors are all white. But the tones are different in accordance with thickness. The thinner the ZnSe substrate is, the cooler the white is. The color temperatures are about 20000K for the 30 $\mu$m thick LED (point J), about 9000K for the 100 $\mu$m thick LED (point K) and about 6000K for the 250 $\mu$m thick LED (point L).

Embodiment 6 clarifies the controllability of the tones of white by changing the thickness of the ZnSe substrate. The above are all embodiments of white color LEDs. The following are embodiments of neutral color LEDs.

[EMBODIMENT 7 (I-dope, 585 nm fluorescence, ZnSe active layer, 465 nm band gap emission, neutral color)

Embodiment 7 employs an I-doped n-type ZnSe wafer as a conductive ZnSe substrate. ZnSe substrate with activation carriers more than $1 \times 10^{18}$ cm$^{-3}$ shows a band tailing phenomenon.

Prepared substrates are 50 μm thick ZnSe single crystal wafers (α), 250 μm thick ZnSe single crystal wafers (β) and 500 μm thick ZnSe single crystal wafers (γ). The intensity of the SA-emission must depend upon the thickness of the ZnSe substrate. Then three kind wafers having different thicknesses are prepared. Epitaxial emission (LED) structures are made on the ZnSe wafers.

The MBE apparatus of FIG. 15 homoepitaxially produces the epitaxial emission structure shown in FIG. 19. The neutral color ZnSe LED 15 has an n-type ZnSe single crystal substrate 16, an n-type ZnSe buffer layer 201, an n-type ZnMgSSe cladding layer 202, a ZnSe active layer 203, a p-type BeZnMgSe cladding layer 204 and a p-type ZnTe/ZnSe superlattice contact layer 205.

Details of the layers including the ratios of mixtures are as follows.

(1) I-doped ZnSe substrate 16 (CVT method; 50 μm, 250 μm, 500 μm)
(2) n-type ZnSe buffer layer 201
(3) n-type $Zn_{0.85}Mg_{0.15}S_{0.10}Se_{0.90}$ cladding layer 202
(4) ZnSe active layer 203
(5) p-type $Be_{0.20}Mg_{0.20}Zn_{0.60}$ cladding layer 204
(6) p-type ZnTe/ZnSe superlattice contact layer 205

ZnSe is chosen as an active layer for producing the blue light of 465 nm which corresponds to the band gap of ZnSe.

The active layer 203 is non-doped ZnSe. The p-cladding layer and the n-cladding layer make a pn-junction at the non-doped active layer.

The size of a chip is designed to be 250 μm×250 μm. Dot-shaped small p-electrodes made of Pd/Au (palladium/gold) are formed on the p-type ZnTe/ZnSe superlattice contact layer 205 in a two-dimensional period of 250 μm×250 μm which is the same as the chip period. Pd/Au is chosen as a material of the p-electrode, because Pd/Au can make an ohmic contact with the p-ZnTe/ZnSe superlattice. The "dot-shaped" electrode means that a small round electrode pad is produced on every chip. Since a plenty of dot-shaped p-electrodes are arranged crosswise and lengthwise on a ZnSe wafer, the p-electrodes seem a uniform dotted pattern. Since the LED takes out the light from the p-electrode surface, it is desirable for the opaque Pd/Au electrodes to be small enough not to shadow the light. As long as the p-electrode is small enough, both the center and the periphery of a chip are allowable for the position of the electrode. An annular p-electrode is also available.

Then, an Au electrode film of a thickness less than 20 nm is deposited on all the wafer. The Au film covers both the Pd/Au p-electrodes and the exposed ZnSe/ZnTe layer 205. The reason why the Au film is further deposited on the contact layer 205 is to diffuse the electric current in the LED chip. The p-electrode is substantially expanded over the whole of the contact layer 205. As long as the Au film is thinner than 20 nm, the light can pass the Au film. The Au film itself comes into an ohmic contact with the p-ZnSe/ZnTe contact layer 205. The wire which connects the p-electrode with a lead should be bonded upon the Pd/Au electrode.

In-electrodes are formed on the bottom surface of the epitaxial ZnSe wafer 15 as n-electrodes. Indium (In) comes into ohmic contact with the n-type ZnSe. The above steps are wafer processes which are done on a wafer.

After the electrodes have been produced, the ZnSe epitaxial wafer is cut into a lot of square chips of 250 μm×250 μm. The chip is fitted in a normal posture on a stem with the epitaxial structure upward and the ZnSe substrate downward shown in FIG. 3(a). The n-electrode is directly connected to the stem 12. The dotted p-electrode is connected to the stem 13 by wirebonding. LEDs are produced by molding the chip 15 and the stems 12 and 13 with a transparent plastic 11 (e.g. epoxy resin).

The LEDs are driven in a constant current mode for measuring the output light power. The LEDs emit high luminosity of purple light, purplepink light and pink light which are neutral colors between red and blue. The typical emission intensity is 1.5 mW for 20 mA. The tones of the neutral colors vary in accordance with the thickness of the I-doped ZnSe substrates.

| (α) | 50 μm thickness of ZnSe substrate | purple |
| (β) | 250 μm thickness of ZnSe substrate | purplepink |
| (γ) | 500 μm thickness of ZnSe substrate | pink |

FIG. 20 is an emission spectrum of the LED of embodiment 7. The abscissa is wavelength (nm). The ordinate is emission intensity (arbitrary unit). The sharp 465 nm peak originates from the band gap transition emission at the ZnSe active layer. The peak height of the ZnSe active layer is constant irrespective of the thickness of the substrates. In addition to the 465 nm peak, three peaks appear on a longer wavelength side. The longer wavelength components result from the SA-emission in the ZnSe substrate. All the three are broad peaks ranging from 550 nm to 670 nm. 585 nm is the center of the peaks. Sample (α) of the 50 μm thick substrate makes the weakest SA-emission peak. This is caused by the thinnest substrate and the least SA-centers. Sample (β) of the 250 μm thick substrate produces a higher SA-emission peak than α. Sample (γ) emits the strongest SA-emission due to the thickest substrate and the most SA-centers. The 585 nm centered SA-emission increases in proportion to the increment of the substrate thickness. The change of the spectrum confirms the fact that the ZnSe substrate actually emits SA-rays.

Figure 21:
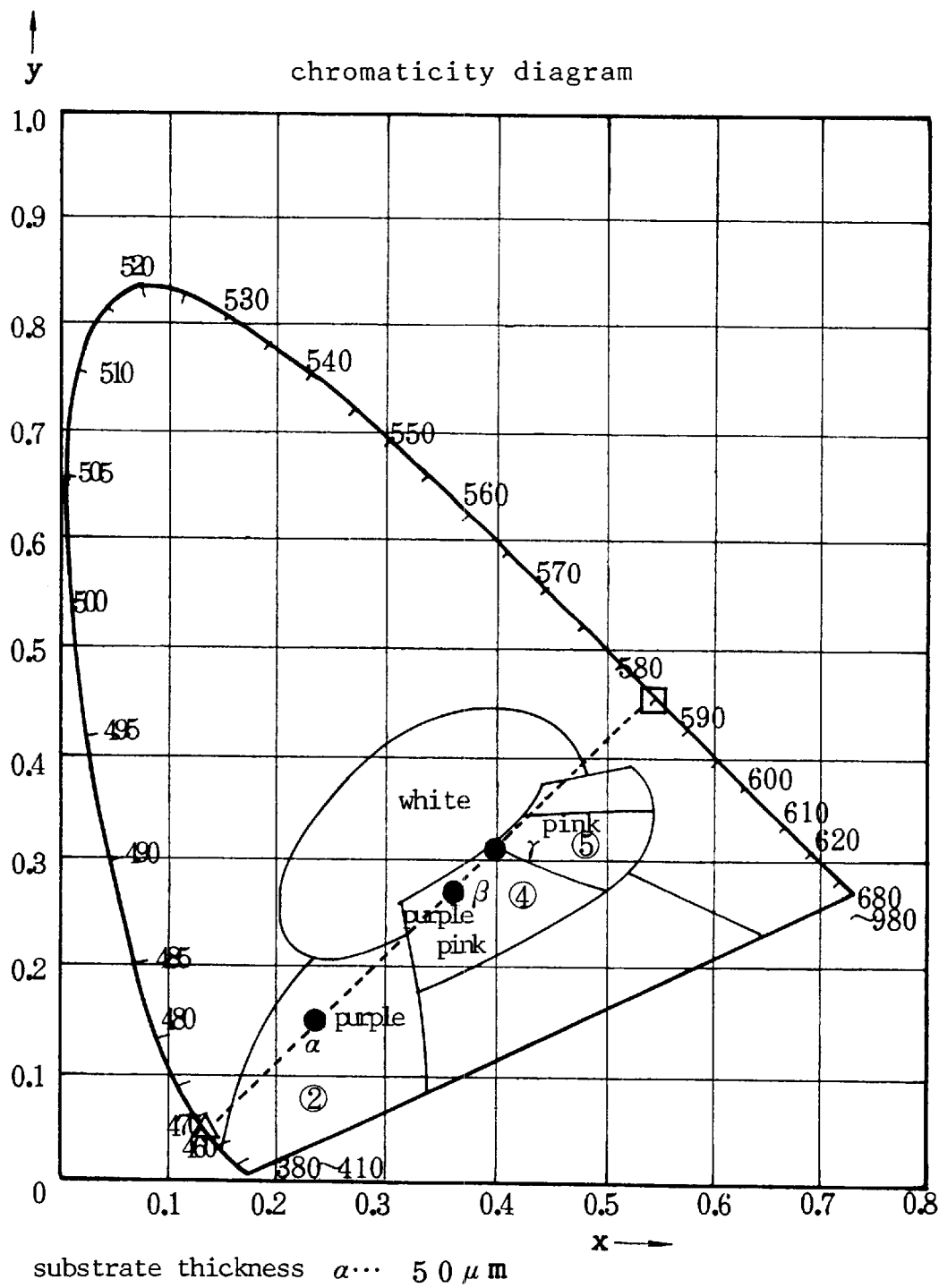
FIG. 21 is a chromaticity diagram of the neutral color LED of embodiment 7 including samples α(50 μm), β(250 μm) and γ(500 μm), the substrate emission (□) and the active layer emission (Δ).

FIG. 21 is a chromaticity diagram showing the emission spectra of samples α, β and γ as coordinate points.

(α) 50 μm thick ZnSe substrate . . . chromaticity(x,y)= (0.24, 0.15) purple (β) 250 μm thick ZnSe substrate . . . chromaticity(x,y)= (0.36, 0.27) purplepink (γ) 500 μm thick ZnSe substrate . . . chromaticity(x,y)= (0.40, 0.31) pink FIG. 21 denotes also the chromaticity coordinate (Δ) of the blue light from the epitaxial emission layer and the chromaticity coordinate (□) of the SA-emission from the ZnSe substrate. The chromaticity coordinates of three samples α, β and γ align on the line connecting two points. Namely, the colors of samples α, β and γ are simply obtained by synthesizing two colors (Δ and □). Three samples have different colors, because the thicknesses of the substrates are different. Sample α having the thinnest substrate makes purple light which is the closest to the band gap emission of 465 nm. Sample γ having the thickest substrate produces pink light which is the closest to the SA-emission (585 nm).

Sample β having an intermediate thick substrate emits purplepink light.

[EMBODIMENT 8 (Aluminum dope, 610 nm fluorescence, ZnSe active layer, 465 nm LED emission, epi-up)]

An aluminum doped n-type ZnSe substrate is chosen as a conductive ZnSe substrate. The Al-doped ZnSe substrate including an active carrier density of about $1 \times 10^{17}$ cm$^{-3}$ can absorb the light having shorter wavelengths than 480 nm which is longer than the ZnSe band gap wavelength of 460 nm and can emit fluorescent light having a broad peak at 610 nm as SA-emission. A 250 μm thick ZnSe substrate (δ) and a 1000 μm thick ZnSe substrate (ε) are prepared. The intensity of the SA-emission should depend upon the thicknesses of the ZnSe substrates. LEDs are made on the ZnSe substrates (δ, ε) having different thicknesses for examining the dependence of colors on the substrate thickness.

The I-doped ZnSe substrate of embodiment 7 absorbs the light between 460 nm and 510 nm and emits the SA-emission having a peak at 585 nm. The Al-doped ZnSe substrate of embodiment 8 absorbs the light from 460 nm to 480 nm and emits the SA-emission having a peak at 610 nm. The dopants of the ZnSe substrates vary the peak wavelengths of the SA-emission. The other structures except for the thickness and the dopant are similar to embodiment 7.

Figure 22:
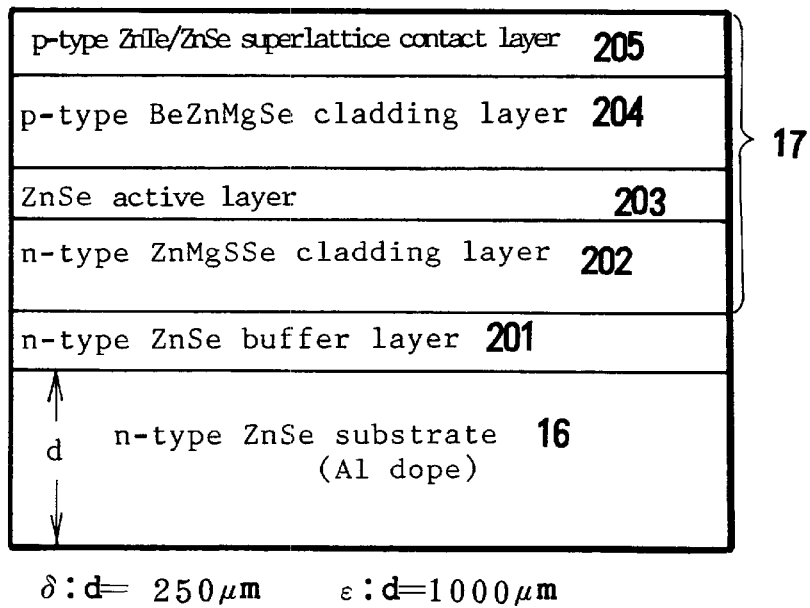
FIG. 22 is epitaxially grown film strata of a neutral LED related to embodiment 8 having a ZnSe active layer and an Al-doped ZnSe substrate.

The active layer is ZnSe which emits 465 nm light by the band gap emission similar to embodiment 7. The cladding layers and the contact layer have the same structures as embodiment 7 shown in FIG. 22. The epitaxial film structure is made by the MBE apparatus of FIG. 15.

(1) aluminum doped n-type ZnSe substrate 16

(2) n-type ZnSe buffer layer 201

(3) n-type $Zn_{0.85}Mg_{0.15}S_{0.10}Se_{0.90}$ cladding layer 202

(4) ZnSe active layer 203

(5) p-type $Be_{0.20}Mg_{0.20}Zn_{0.60}$ Se cladding layer 204

(6) p-type ZnTe/ZnSe superlattice contact layer 205

LEDs of embodiment 8 are made by the wafer processes similar to embodiment 7. Dot-shaped p-electrodes of Pd/Au are formed upon the p-type contact layer 205 at a period of 250 μm×250 μm. Further, a gold thin film is uniformly deposited over the Pd/Au dot p-electrodes for expanding currents. An In n-electrode is formed overall on the bottom of the ZnSe substrate. After the wafer processes, the wafer is cut into a plenty of chips of 250 μm×250 μm. An LED is made by mounting the chip in a normal posture on a stem 12 (in the epi-up mode), as shown in FIG. 3(a). The p-electrode is connected to the stem 12 by wirebonding a wire 18. The chip 15 and the stems 12 and 13 are stored in a transparent plastic package 11.

The LEDs are driven in a constant current mode for measuring the output light. The LEDs emit high luminescent redpurple light. The typical output of the redpurple is 1.5 mW for 20 mA. The thicknesses of substrates vary the tones of the emitted light.

| (δ) ZnSe thickness of 250 μm | purplish redpurple |
|---|---|
| (ε) ZnSe thickness of 1000 μm | reddish redpurple |

Figure 23:
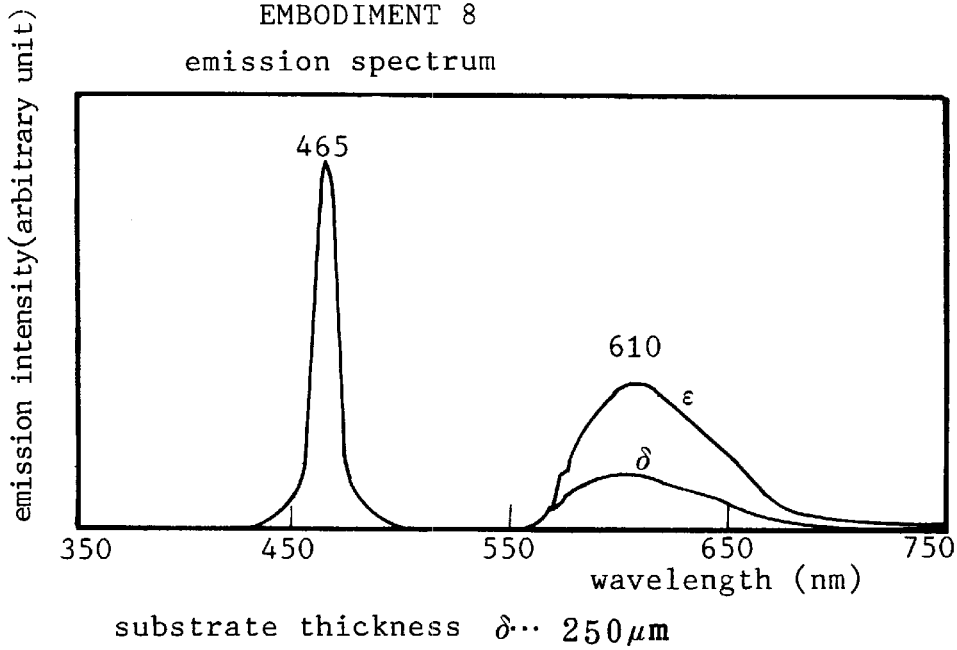
FIG. 23 is an emission spectrum of the neutral color LED of embodiment 8 including two samples δ(250 μm) and ε(1000 μm) having different substrate thicknesses.

FIG. 23 is an emission spectrum of the LEDs of embodiment 8. The abscissa is wavelength (nm). The ordinate is emission intensity (arbitrary unit). There is a sharp peak at 465 nm which originates from the band gap transition emission at the ZnSe active layer 203. The intensity of the blue light from the active layer is constant despite different substrate thicknesses. There are two other peaks ε and δ having longer wavelengths than the 465 nm in the spectrum. The longer-wavelength peaks originate from the SA-emission of the Al-doped ZnSe substrate 16. Both peaks disperse between 570 nm and 680 nm, having broad peaks at 610 nm. The 250 μm thick LED (sample δ) has weaker SA-emission because of a thinner substrate and a smaller number of SA-centers. The 1000 μm thick LED (sample δ) has stronger SA-emission than sample δ. This result implies that the SA-emission increases in proportion to the thickness of the ZnSe substrate.

Figure 24:
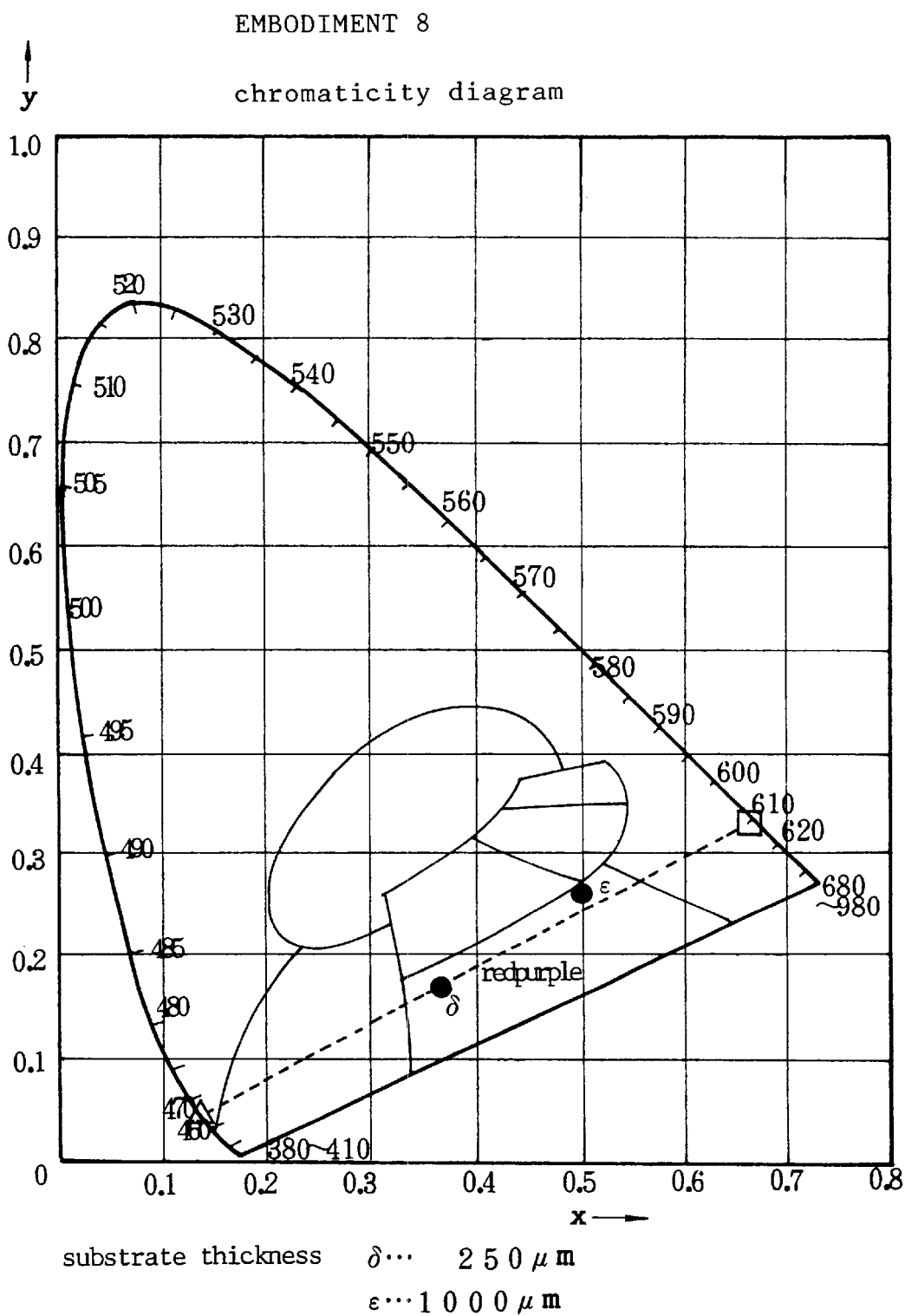
FIG. 24 is a chromaticity diagram of the neutral color LED of embodiment 8 including samples δ(250 μm) and ε(1000 μm), the substrate emission (□) and the active layer emission (Δ).

The chromaticity diagram of embodiment 8 is shown by FIG. 24.

(δ) 250 μm thick substrate . . . chromaticity (x,y)=(0.36, 0.18) purplish redpurple (ε) 1000 μm thick substrate . . . chromaticity (x,y)=(0.50, 0.27) redish redpurple In FIG. 24, the chromaticity from the light from the epitaxial film structure (active layer) is denoted by Δ and the chromaticity of the SA-emission from the ZnSe substrate is denoted by □. Samples δ and ε align on the line connecting the substrate emission □ to the active layer emission Δ. The fact signifies that the neutral colors of samples δ and ε are sums of the band gap emission (active layer) and the SA-emission (substrate). [EMBODIMENT 9 (I+Al dope, 590 nm fluorescence, ZnSe/ZnCdSe active layer, 475 nm, epi-down]

Embodiment 9 chooses an n-type ZnSe wafer doped with iodine (I) and aluminum (Al) as a conductive ZnSe substrate. The ZnSe crystal which is doped with iodine and aluminum and has an active carrier density of about $1 \times 10^{18}$ cm$^{-3}$ can absorb the light having a wavelength λ shorter than 510 nm but longer than 460 nm which is equal to the band gap of ZnSe (460 nm<λ<510 nm) and can emit SA-emission having a broad peak spectrum at 590 nm. This fluorescence originates from the mentioned band tailing phenomenon. The peak wavelength of the SA-emission can be changed by varying dopants in the ZnSe substrate. The intensity of the SA-emission can be changed by varying the thickness of the ZnSe substrate. 50 μm thick ZnSe (I+Al) substrate wafers (ζ) and 150 μm thick ZnSe (I+Al) substrate wafers (η) are prepared.

The epitaxial emission structure having a ZnSe/ZnCdSe multiple quantum well active layer is made by the MBE method. FIG. 25 shows the epitaxial film structure of embodiment 9. An n-type ZnSe buffer layer 206, an n-type $Zn_{0.85}Mg_{0.15}S_{0.10}Se_{0.90}$ cladding layer 207, a ZnSe/$Zn_{0.93}Cd_{0.07}$Se multiple quantum well (MQW) active layer 208, a p-type $Be_{0.20}Mg_{0.20}Zn_{0.60}$ Se cladding layer 209 and a p-type ZnTe/ZnSe superlattice contact layer 210 are epitaxially piled on the n-type Al, I-doped ZnSe substrate 16. The LED film structure is as follows.

(1) n-type Al, I-doped ZnSe substrate 16

(2) n-type ZnSe buffer layer 206

(3) n-type $Zn_{0.85}Mg_{0.15}S_{0.10}Se_{0.90}$ cladding layer 207

(4) ZnSe/$Zn_{0.93}Cd_{0.07}$ Se multiple quantum well active layer 208

(5) p-type $Be_{0.20}Mg_{0.20}Zn_{0.60}$ Se cladding layer 209

(6) p-type ZnTe/ZnSe superlattice contact layer 210

Embodiments 7 and 8 having ZnSe active layers emit 465 nm light from the active layers. Instead of ZnSe, embodiment 9 employs a ZnSe/ZnCdSe multiple quantum well as an active layer. Embodiment 9 emits 475 nm blue light from the MQW active layer 208. The ZnSe/ZnCdSe MQW layer 208 can be replaced by a $ZnSe_{0.99}Te_{0.01}$ active layer for producing 475 nm light. The n-type cladding layer 207 is the same as the former embodiments.

A Pd/Au p-electrode is uniformly formed upon the whole of the p-type ZnTe/ZnSe superlattice contact layer 210. Since this embodiment mounts the LED in the epi-down mode upon the stem, the light will emit from the substrate. The overall p-electrode covering the p-type ZnSe/ZnTe contact layer 210 does not hinder the light emitting from the LED. Lattice-shaped n-electrodes of In or Ti/Au are formed in a period of 250 μm×250 μm upon the bottom of the ZnSe substrate 16. Then, the wafer is scribed along the lattice n-electrodes in the same period of 250 μm×250 μm into many equivalent chips. The chips have peripheral n-electrodes on their bottoms. Instead of the lattice-shaped n-electrodes, dotted n-electrodes may be formed on the bottom of the ZnSe substrate wafer in the same period.

The chip is upside down upon a top branch 24 of a stem 22 with the epitaxial film structure 27 downward, as shown in FIG. 5(*a*). The top n-electrode on the substrate 26 is connected to a lead 23 by a wire 28. The chip 25 and the upper parts of the leads 22 and 23 are molded in the plastic resin 21.

When electric current is supplied to the LEDs, the LEDs emit pink light and yellowish pink light. The typical emission intensity is 1.2 mW at a current of 20 mA. The light is slightly weaker than embodiments 7 and 8. The tones of neural colors depend on the thickness of the ZnSe substrates.

(ζ) 50 μm thick ZnSe substrate . . . pink (η) 150 μm thick ZnSe substrate . . . yellowish pink FIG. 26 shows an emission spectrum of embodiment 9. The spectrum has a 475 nm peak which is the blue light from the active layer 208 in the epitaxial film structure and a 590 nm broad peak which is the SA-emission from the Al, I-doped ZnSe substrates 16. The SA-emission of the 50 μm thick LED (ζ) is weaker than that of the 150 μm thick LED (η). This fact verifies that the ZnSe substrate is the origin of the 590 nm light. The intensity of the 475 nm light from the epitaxial film structure is common for LEDs ζ and η.

Figure 27:
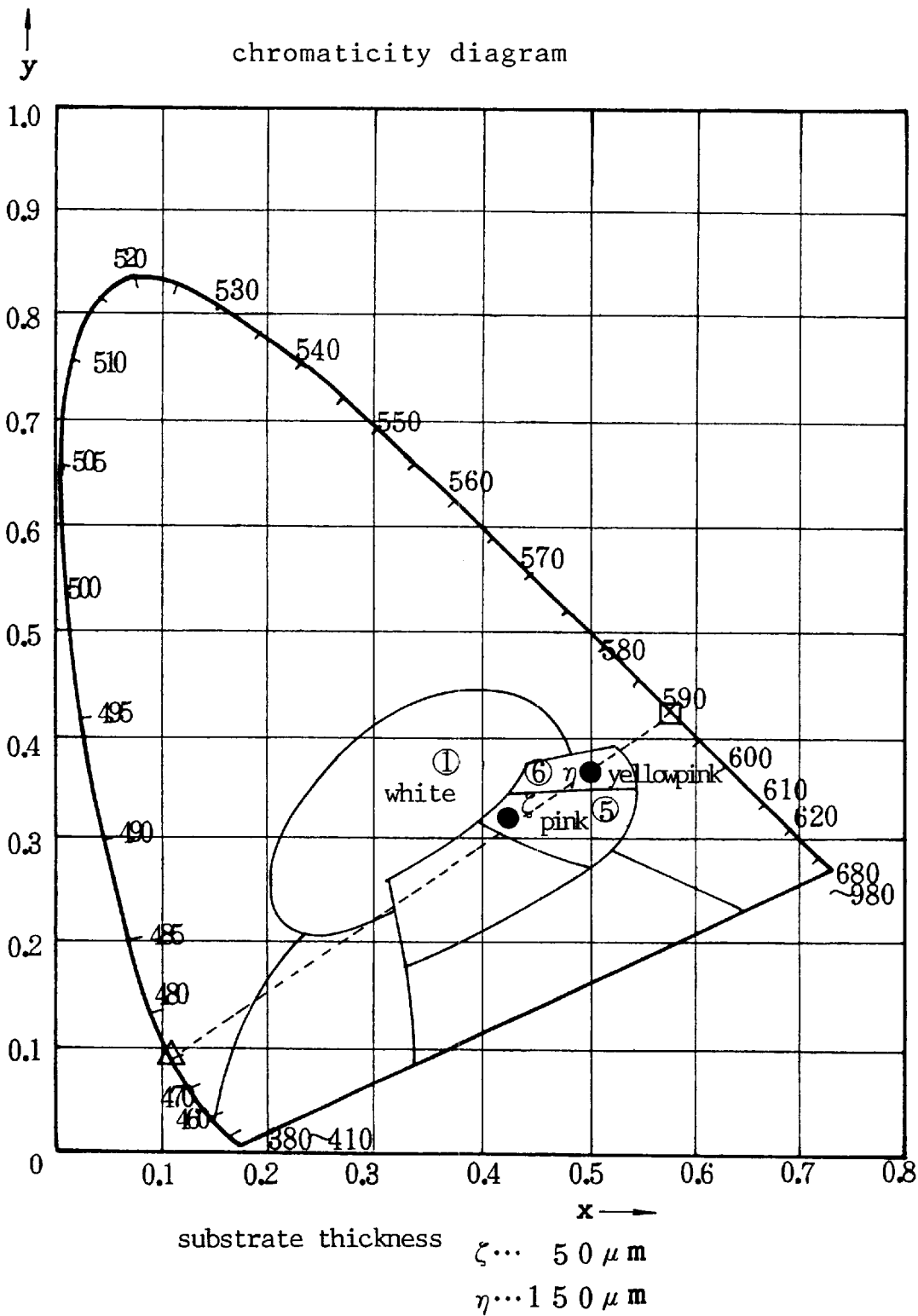
FIG. 27 is a chromaticity diagram of a neutral color LED related to embodiment 9 including samples ζ(50 μm) and η(150 μm), the substrate emission (□) and the active layer emission (Δ).

FIG. 27 is a chromaticity diagram of embodiment 9 having samples ζ and η.

(ζ) 50 μm thick sample . . . chromaticity (x,y)=(0.42, 0.32) pink (η) 150 μm thick sample . . . chromaticity (x,y)=(0.50, 0.37) yellowish pink FIG. 27 also shows chromaticity coordinates of the 475 nm light (Δ) from the epitaxial film structure and the 590 nm SA-emission (□) from the ZnSe substrate. Samples ζ and η have chromaticity coordinates on the line connecting □ and Δ.

Figure 28:
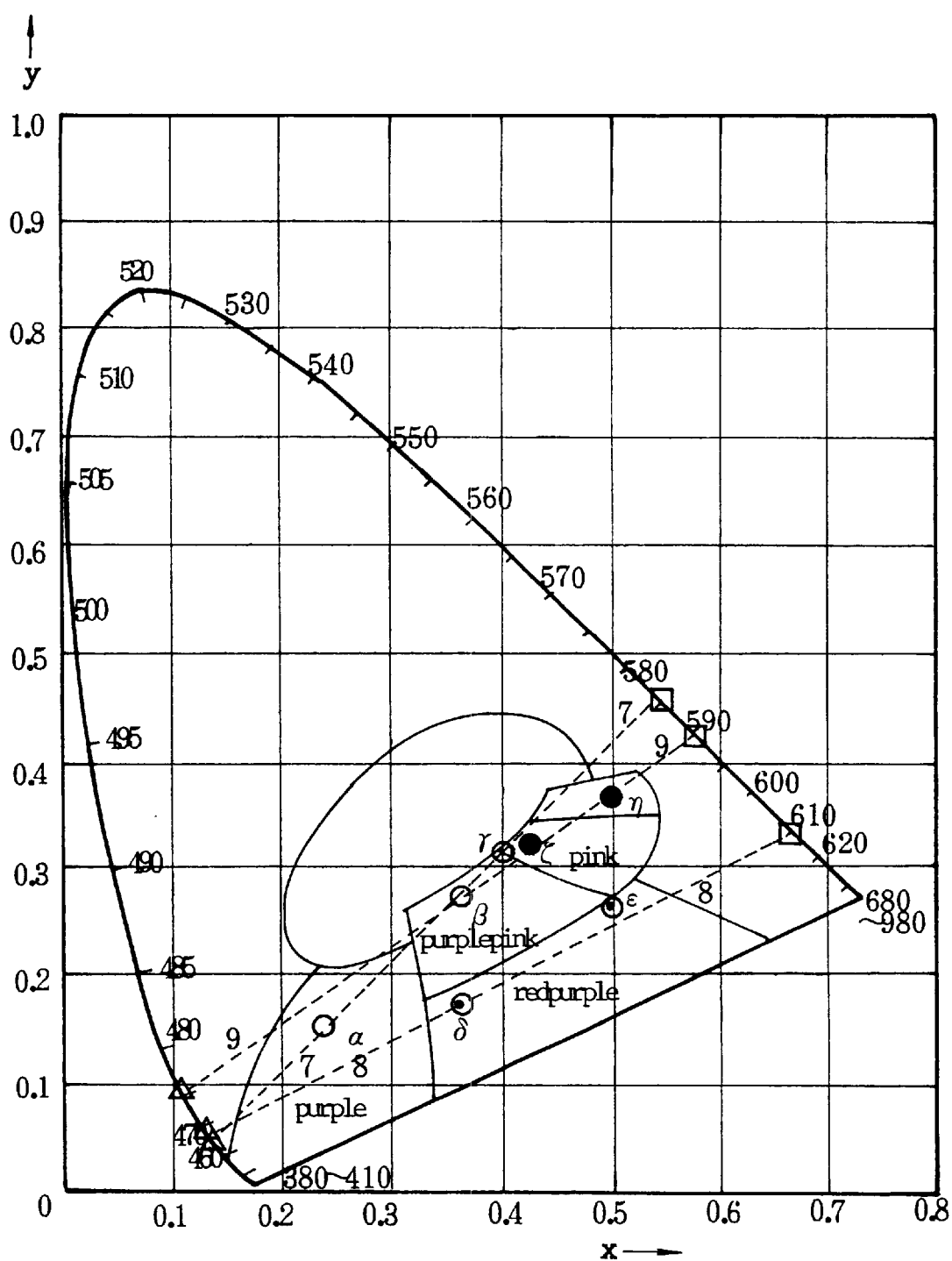
FIG. 28 is a chromaticity diagram of neutral color LEDs related to embodiments 7, 8 and 9, including the substrate emission (□) and the active layer emission (Δ).
Figure 30:
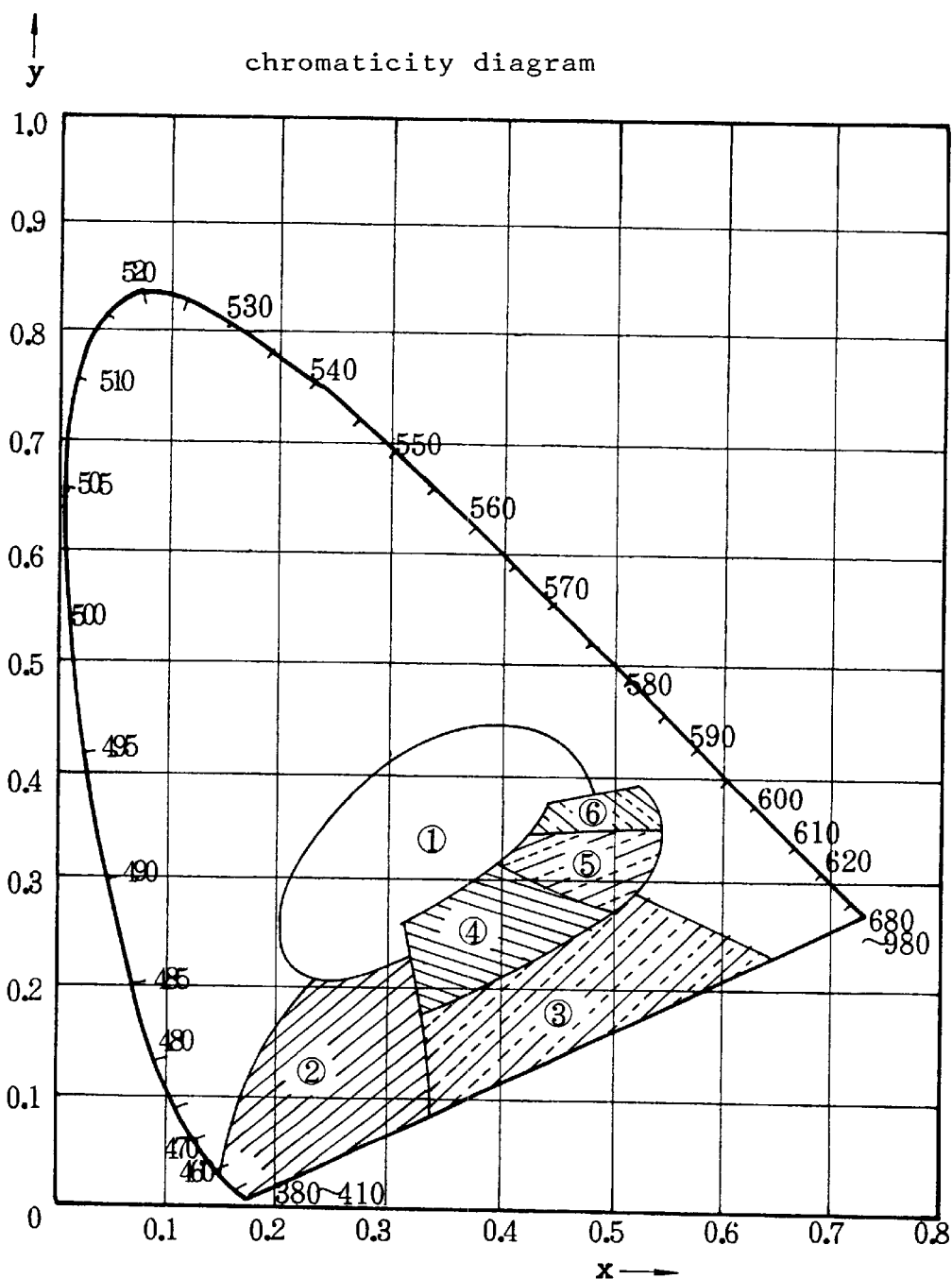
FIG. 30 is a chromaticity diagram which denotes the regions of the neutral colors ②, ③, ④, ⑤ and ⑥ which are the objects of the LEDs of the present invention.
Figure 31:
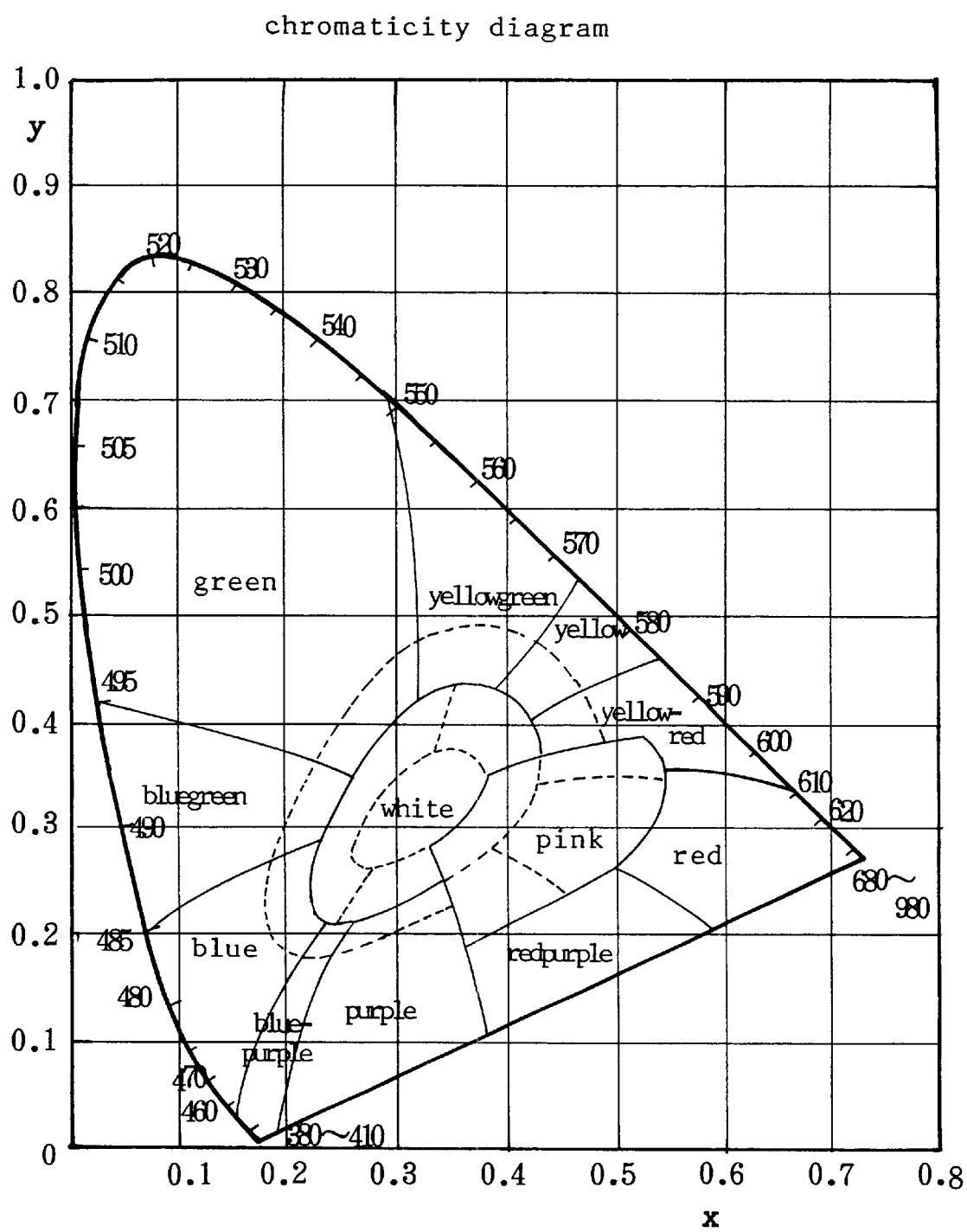
FIG. 31 is a general chromaticity diagram which represents the primary colors of red, green and blue and neutral colors, e.g. bluegreen, yellowgreen, redyellow, redpurple, bluepurple in the chromaticity coordinates (x,y).

FIG. 28 is a chromaticity diagram showing the chromaticity of the synthesized neutral color light points, the epitaxial film light points (Δ) and the ZnSe substrate SA-emission points (□) of embodiments 7, 8 and 9. Dotted lines show the synthesized color lines of embodiments 7, 8 and 9. Blank rounds (○)(α,β,γ: embodiment 7), dotted rounds (◉)(δ, ε: embodiment 8) and black rounds (●)(ζ,η: embodiment 9) show the synthesized neutral colors of embodiments 7, 8 and 9. The diagram proves the fact that desired neural colors between red and blue can be produced by ZnSe-type LEDs by changing the wavelengths of light from the epitaxial film structures and the wavelengths of light from the impurity-doped ZnSe substrates. The results teach us that purple-red neutral colors, e.g. purple, redpurple, pink and so on, can be obtained by changing the band gap emission of the active layer within a scope between 460 nm and 495 nm and by changing the SA-emission of the substrate within a scope between 550 nm and 650 nm.

FIG. 29 is a table of the materials of substrate, the wavelengths of SA-emission, the materials of active layer, the wavelengths of emission from the active layers, the thicknesses of substrate, the embodiment symbols, the chromaticity coordinates, and the colors for embodiments 7, 8 and 9.

What is claimed is:

1. A white color LED comprising:
    an n-type ZnSe single crystal substrate doped with iodine (I), bromine (Br), chlorine (Cl), gallium (Ga), indium (In) or aluminum (Al) which acts both as an n-type dopant and as a self-activated (SA) emission center which absorbs blue or bluegreen light and makes yellow or orange light; and
    an epitaxial film structure epitaxially grown on the ZnSe substrate, the epitaxial film structure having a pn-junction and an active layer made of a ZnSe crystal or a ZnSe-related compound crystal for emitting blue light or bluegreen light;
    wherein the ZnSe substrate produces and emits white light by mixing the light from the epitaxial film structure with the light from the SA-emission centers.

2. A white color LED as claimed in claim 1, wherein the epitaxial film structure is a multi-layer structure including a ZnSe active layer or a $Zn_{1-x}Cd_xSe$ active layer which produces blue or bluegreen light having a wavelength of from 460 nm to 510 nm, and the ZnSe substrate makes SA-emission having a wavelength of from 550 nm to 650 nm.

3. A white color LED as claimed in claim 2, wherein tone of white light is changed from cold white to warm white by varying the thickness of the ZnSe substrate in the range from 10 μm to 2 mm.

4. A white color LED as claimed in claim 2, wherein tone of white light is changed by varying active layer components in the epitaxial film structure.

5. A white color LED as claimed in claim 2, wherein tone of white light is changed by varying dopant concentrations in the ZnSe substrate.

6. A white color LED as claimed in claim 1, wherein the LED is upside down mounted on a flat stem of a Γ-shaped lead with the epitaxial film structure being in contact with the stem.

7. A white color LED as claimed in claim 6, wherein the ZnSe substrate has a cavity in a top surface, the epitaxial film structure has a ZnSe or $Zn_{1-x}Cd_xSe$ active layer formed on a bottom of the cavity of the ZnSe substrate, the stem has a protrusion on the top surface, and the epitaxial film structure is fitted on the protrusion of the stem for enclosing the epitaxial film structure by the ZnSe substrate.

8. A white color LED as claimed in claim 1, wherein the LED is mounted on a bottom of a cavity made in a stem of a Γ-shaped lead.

9. A white color LED as claimed in claim 8, wherein the LED is upside down on the bottom of the cavity of the stem.

10. A neutral color LED comprising:
    an n-type ZnSe single crystal substrate doped with iodine (I), bromine (Br), chlorine (Cl), gallium (Ga), indium (In) or aluminum (Al) which acts both as an n-type dopant and as a self-activated (SA) emission center which absorbs blue light and makes yellow or orange light; and
    an epitaxial film structure epitaxially grown on the ZnSe substrate, the epitaxial film structure having a pn-junction and an active layer made of a ZnSe crystal or a ZnSe-related compound crystal for emitting blue light;
    wherein the ZnSe substrate produces and emits neutral color light, by mixing the light from the epitaxial film structure with the light from the SA-emission centers.

11. A neutral color LED as claimed in claim 10, wherein the epitaxial film structure is a multi-layer structure including a ZnSe active layer, a $Zn_{1-x}Cd_xSe$ active layer or a $ZnSe_{1-y}Te_y$ active layer which produces blue light having a wavelength of from 460 nm to 495 nm, and the ZnSe substrate makes SA-emission having a wavelength of from 550 nm to 650 nm.

12. A neutral color LED as claimed in claim 11, wherein the neutral color light is changed from bluepurple via purple to redpurple by varying the thickness of the ZnSe substrate in a range from 10 μm to 2 mm.

13. A neutral color LED as claimed in claim 11, wherein the neutral color light is changed from purplish pink via pink to yellowish pink by varying the thickness of the ZnSe substrate in a range from 10 μm to 2 mm.

14. A neutral color LED as claimed in claim 11, wherein the neutral color light is changed by varying active layer components in the epitaxial film structure.

15. A neutral color LED as claimed in claim 11, wherein the neutral color light is changed by varying dopant concentrations in the ZnSe substrate.

16. A neutral color LED as claimed in claim 10, wherein the LED is upside down mounted on a flat stem of a Γ-shaped lead with the epitaxial film structure being in contact with the stem.

17. A neutral color LED as claimed in claim 16, wherein the ZnSe substrate has a cavity on a top surface, the epitaxial film structure has a ZnSe, $Zn_{1-x}Cd_xSe$ or $Zn_{1-y}Te_y$ active layer formed on a bottom of the cavity of the ZnSe substrate, the stem has a protrusion on a top surface, the epitaxial film structure is fitted on the protrusion of the stem for enclosing the epitaxial film structure by the ZnSe substrate.

18. A neutral color LED as claimed in claim 10, wherein the LED is mounted on a bottom of a cavity made on a stem of a Γ-shaped lead.

19. A neutral color LED as claimed in claim 18, wherein the LED is upside down on the bottom of the cavity of the stem.

* * * * *